(12) United States Patent
Micheloni et al.

(10) Patent No.: US 10,332,613 B1
(45) Date of Patent: Jun. 25, 2019

(54) NONVOLATILE MEMORY SYSTEM WITH RETENTION MONITOR

(71) Applicant: Microsemi Solutions (U.S.), Inc., Aliso Viejo, CA (US)

(72) Inventors: Rino Micheloni, Turate (IT); Alessia Marelli, Dalmine (IT); Robert Scott Fryman, Roseville, CA (US)

(73) Assignee: Microsemi Solutions (US), Inc., Chandler, AZ (US)

( * ) Notice: Subject to any disclaimer, the term of this patent is extended or adjusted under 35 U.S.C. 154(b) by 253 days.

(21) Appl. No.: 14/715,403

(22) Filed: May 18, 2015

(51) Int. Cl.
| | |
|---|---|
| *G11C 29/38* | (2006.01) |
| *G11C 29/44* | (2006.01) |
| *G11C 29/00* | (2006.01) |
| *G11C 29/54* | (2006.01) |

(52) U.S. Cl.
CPC .............. *G11C 29/38* (2013.01); *G11C 29/44* (2013.01); *G11C 29/702* (2013.01)

(58) Field of Classification Search
CPC ......... G11C 29/56; G11C 29/48; G11C 29/40; G11C 29/38; G11C 29/44; G11C 29/702; G11C 29/50016
See application file for complete search history.

(56) References Cited

U.S. PATENT DOCUMENTS

| | | |
|---|---|---|
| 815,137 A | 3/1906 | Beecher |
| 5,615,235 A | 3/1997 | Kakuishi et al. |
| 5,732,092 A | 3/1998 | Shinohara |
| 5,822,244 A | 10/1998 | Hansen et al. |
| 5,875,343 A | 2/1999 | Binford et al. |
| 5,877,956 A * | 3/1999 | Frank ...................... G06F 11/22 700/79 |
| 6,115,788 A | 9/2000 | Thowe |
| 6,148,360 A | 11/2000 | Leak et al. |
| 6,412,041 B1 | 6/2002 | Lee et al. |
| 6,539,515 B1 | 3/2003 | Gong |
| 6,567,313 B2 | 5/2003 | Tanaka et al. |
| 6,633,856 B2 | 10/2003 | Richardson et al. |
| 6,725,409 B1 | 4/2004 | Wolf |
| 6,789,227 B2 | 9/2004 | De Souza et al. |

(Continued)

OTHER PUBLICATIONS

NVM Express, Revision 1.0; Intel Corporation; Mar. 1, 2011.

(Continued)

*Primary Examiner* — April Y Blair
*Assistant Examiner* — Dipakkumar B Gandhi
(74) *Attorney, Agent, or Firm* — Glass & Associates; Kenneth Glass

(57) ABSTRACT

A nonvolatile memory system, a nonvolatile memory controller and a method for assuring retention are disclosed. The nonvolatile memory controller includes a retention monitor that stores test characteristics corresponding to a use case and determines, each time that a read of a codeword is performed, whether the number of errors in the codeword exceed a retention threshold. If the number of errors in the codeword exceed the retention threshold, the block containing the codeword is retired. The retention monitor performs retention tests during the operation of the memory controller and adjusts the retention threshold when the results of the retention tests indicate deviation from the test characteristics corresponding to a use case.

10 Claims, 12 Drawing Sheets

(56) References Cited

U.S. PATENT DOCUMENTS

| | | | |
|---|---|---|---|
| 6,871,168 B1* | 3/2005 | Tanaka | G11C 29/56 702/185 |
| 6,895,547 B2 | 5/2005 | Eleftheriou et al. | |
| 6,934,804 B2 | 8/2005 | Hashemi | |
| 6,963,507 B2 | 11/2005 | Tanaka et al. | |
| 6,965,537 B1* | 11/2005 | Klein | G06F 11/106 365/200 |
| 6,976,194 B2 | 12/2005 | Cypher | |
| 6,976,197 B2 | 12/2005 | Faust et al. | |
| 7,032,081 B1 | 4/2006 | Gefen et al. | |
| 7,050,334 B2 | 5/2006 | Kim et al. | |
| 7,116,732 B2 | 10/2006 | Worm et al. | |
| 7,206,992 B2 | 4/2007 | Xin et al. | |
| 7,209,527 B2 | 4/2007 | Smith et al. | |
| 7,237,183 B2 | 6/2007 | Xin | |
| 7,324,559 B2 | 1/2008 | McGibney | |
| 7,376,015 B2 | 5/2008 | Tanaka et al. | |
| 7,450,668 B2 | 11/2008 | Ghosh et al. | |
| 7,457,906 B2 | 11/2008 | Pettey et al. | |
| 7,472,331 B2 | 12/2008 | Kim et al. | |
| 7,484,158 B2 | 1/2009 | Sharon et al. | |
| 7,529,215 B2 | 5/2009 | Osterling | |
| 7,567,472 B2 | 7/2009 | Gatzemeier et al. | |
| 7,620,784 B2 | 11/2009 | Panabaker et al. | |
| 7,650,480 B2 | 1/2010 | Jiang et al. | |
| 7,694,047 B1 | 4/2010 | Alston | |
| 7,708,195 B2 | 5/2010 | Yoshida et al. | |
| 7,739,472 B2 | 6/2010 | Guterman et al. | |
| 7,752,346 B2 | 7/2010 | Talayco et al. | |
| 7,801,233 B1 | 9/2010 | Chow et al. | |
| 7,860,930 B2 | 12/2010 | Freimuth et al. | |
| 7,904,793 B2 | 3/2011 | Mokhlesi et al. | |
| 7,930,623 B2 | 4/2011 | Pisek et al. | |
| 7,937,641 B2 | 5/2011 | Amidi | |
| 7,945,721 B1 | 5/2011 | Johnsen et al. | |
| 7,958,430 B1 | 6/2011 | Kolokowsky et al. | |
| 7,975,193 B2 | 7/2011 | Johnson | |
| 8,094,508 B2 | 1/2012 | Gatzemeier et al. | |
| 8,140,930 B1 | 3/2012 | Maru | |
| 8,176,367 B2 | 5/2012 | Dreifus et al. | |
| 8,219,894 B2 | 7/2012 | Au et al. | |
| 8,223,745 B2 | 7/2012 | Johnsen et al. | |
| 8,228,728 B1 | 7/2012 | Yang et al. | |
| 8,244,946 B2 | 8/2012 | Gupta et al. | |
| 8,245,112 B2 | 8/2012 | Hicken et al. | |
| 8,245,117 B1 | 8/2012 | Wu | |
| 8,250,286 B2 | 8/2012 | Yeh et al. | |
| 8,254,112 B2 | 8/2012 | Yang et al. | |
| 8,255,770 B2 | 8/2012 | Park et al. | |
| 8,259,498 B2 | 9/2012 | Yogev et al. | |
| 8,259,506 B1 | 9/2012 | Sommer et al. | |
| 8,261,136 B2 | 9/2012 | D'Abreu et al. | |
| 8,281,217 B2 | 10/2012 | Kim et al. | |
| 8,281,227 B2 | 10/2012 | Inskeep et al. | |
| 8,286,004 B2 | 10/2012 | Williams | |
| 8,307,258 B2 | 11/2012 | Flynn et al. | |
| 8,327,220 B2 | 12/2012 | Borchers et al. | |
| 8,335,977 B2 | 12/2012 | Weingarten et al. | |
| 8,341,502 B2 | 12/2012 | Steiner et al. | |
| 8,351,258 B1 | 1/2013 | Yang et al. | |
| 8,359,522 B2 | 1/2013 | Gunnam et al. | |
| 8,392,789 B2 | 3/2013 | Biscondi et al. | |
| 8,402,201 B2 | 3/2013 | Strasser et al. | |
| 8,418,023 B2 | 4/2013 | Gunnam et al. | |
| 8,429,325 B1 | 4/2013 | Onufryk et al. | |
| 8,429,497 B2 | 4/2013 | Tu et al. | |
| 8,473,812 B2 | 6/2013 | Ramamoorthy et al. | |
| 8,493,791 B2 | 7/2013 | Karakulak et al. | |
| 8,504,885 B2 | 8/2013 | Haratsch et al. | |
| 8,504,887 B1 | 8/2013 | Varnica et al. | |
| 8,555,140 B2 | 10/2013 | Gunnam et al. | |
| 8,621,318 B1 | 12/2013 | Micheloni et al. | |
| 8,638,602 B1 | 1/2014 | Horn et al. | |
| 8,640,005 B2 | 1/2014 | Wilkerson et al. | |
| 8,645,613 B2 | 2/2014 | Tan et al. | |
| 8,656,257 B1 | 2/2014 | Micheloni et al. | |
| 8,665,648 B2 | 3/2014 | Mun et al. | |
| 8,694,849 B1 | 4/2014 | Micheloni et al. | |
| 8,694,855 B1 | 4/2014 | Micheloni et al. | |
| 8,706,956 B2 | 4/2014 | Cagno et al. | |
| 8,707,122 B1 | 4/2014 | Micheloni et al. | |
| 8,737,141 B2 | 5/2014 | Melik-Martirosian | |
| 8,739,008 B2 | 5/2014 | Liu et al. | |
| 8,755,229 B1 | 6/2014 | Visconti et al. | |
| 8,762,620 B2 | 6/2014 | Prins et al. | |
| 8,769,374 B2 | 7/2014 | Franceschini et al. | |
| 8,775,913 B2 | 7/2014 | Haratsch et al. | |
| 8,787,428 B2 | 7/2014 | Dai et al. | |
| 8,856,622 B2 | 10/2014 | Ramamoorthy et al. | |
| 8,898,372 B2 | 11/2014 | Yeh | |
| 8,917,734 B1 | 12/2014 | Brown | |
| 8,924,824 B1 | 12/2014 | Lu | |
| 8,953,373 B1 | 2/2015 | Haratsch et al. | |
| 8,958,247 B2 | 2/2015 | Asaoka et al. | |
| 8,959,280 B2 | 2/2015 | Ma et al. | |
| 8,984,216 B2 | 3/2015 | Fillingim | |
| 8,995,197 B1 | 3/2015 | Steiner et al. | |
| 8,995,302 B1 | 3/2015 | Brown et al. | |
| 9,025,495 B1 | 5/2015 | Onufryk et al. | |
| 9,058,289 B2 | 6/2015 | Tai et al. | |
| 9,142,314 B2 | 9/2015 | Beltrami et al. | |
| 9,164,891 B2 | 10/2015 | Karamcheti et al. | |
| 9,244,763 B1 | 1/2016 | Kankani et al. | |
| 9,251,909 B1 | 2/2016 | Camp et al. | |
| 9,257,182 B2 | 2/2016 | Grunzke | |
| 9,268,531 B1 | 2/2016 | Son et al. | |
| 9,292,428 B2 | 3/2016 | Kanamori et al. | |
| 9,294,132 B1 | 3/2016 | Peleato-Inarrea | |
| 9,397,701 B1 | 7/2016 | Micheloni et al. | |
| 9,444,655 B2 | 9/2016 | Sverdlov et al. | |
| 9,590,656 B2 | 3/2017 | Micheloni et al. | |
| 9,842,022 B2 | 12/2017 | Motwani | |
| 9,886,214 B2 | 2/2018 | Micheloni et al. | |
| 9,916,906 B2 | 3/2018 | Wu et al. | |
| 2002/0051501 A1 | 5/2002 | Demjanenko et al. | |
| 2002/0129308 A1* | 9/2002 | Kinoshita | G11C 29/40 714/719 |
| 2002/0181438 A1 | 12/2002 | McGibney | |
| 2003/0033567 A1 | 2/2003 | Tamura et al. | |
| 2003/0104788 A1 | 6/2003 | Kim | |
| 2003/0225970 A1 | 12/2003 | Hashemi | |
| 2004/0088636 A1 | 5/2004 | Cypher | |
| 2004/0123230 A1 | 6/2004 | Lee et al. | |
| 2004/0136236 A1 | 7/2004 | Cohen et al. | |
| 2004/0181735 A1 | 9/2004 | Xin | |
| 2004/0234150 A1 | 11/2004 | Chang | |
| 2004/0252791 A1 | 12/2004 | Shen et al. | |
| 2004/0268015 A1 | 12/2004 | Pettey et al. | |
| 2005/0010846 A1 | 1/2005 | Kikuchi et al. | |
| 2005/0226355 A1 | 10/2005 | Kibune et al. | |
| 2005/0248999 A1 | 11/2005 | Tamura et al. | |
| 2005/0252791 A1 | 11/2005 | Pechtold et al. | |
| 2005/0286511 A1 | 12/2005 | Johnsen et al. | |
| 2006/0039370 A1 | 2/2006 | Rosen et al. | |
| 2006/0050694 A1 | 3/2006 | Bury et al. | |
| 2006/0126728 A1 | 6/2006 | Yu et al. | |
| 2006/0206655 A1 | 9/2006 | Chappell et al. | |
| 2006/0282603 A1 | 12/2006 | Onufryk et al. | |
| 2007/0050688 A1 | 3/2007 | Thayer | |
| 2007/0089031 A1 | 4/2007 | Huffman et al. | |
| 2007/0101225 A1* | 5/2007 | Moon | G11C 29/10 714/736 |
| 2007/0118743 A1 | 5/2007 | Thornton et al. | |
| 2007/0136628 A1 | 6/2007 | Doi et al. | |
| 2007/0147489 A1 | 6/2007 | Sun et al. | |
| 2007/0217253 A1 | 9/2007 | Kim et al. | |
| 2007/0233939 A1 | 10/2007 | Kim | |
| 2007/0239926 A1 | 10/2007 | Gyl et al. | |
| 2007/0294588 A1* | 12/2007 | Coulson | G06F 11/1068 714/42 |
| 2008/0005382 A1 | 1/2008 | Mimatsu | |
| 2008/0016425 A1 | 1/2008 | Khan et al. | |
| 2008/0049869 A1 | 2/2008 | Heinrich et al. | |
| 2008/0077843 A1 | 3/2008 | Cho et al. | |

(56) References Cited

U.S. PATENT DOCUMENTS

| | | | |
|---|---|---|---|
| 2008/0148129 A1* | 6/2008 | Moon | H03M 13/15 714/758 |
| 2008/0229079 A1 | 9/2008 | Flynn et al. | |
| 2008/0229164 A1 | 9/2008 | Tamura et al. | |
| 2008/0256280 A1 | 10/2008 | Ma | |
| 2008/0256292 A1 | 10/2008 | Flynn et al. | |
| 2008/0263265 A1 | 10/2008 | Litsyn et al. | |
| 2008/0267081 A1 | 10/2008 | Roeck | |
| 2008/0276156 A1 | 11/2008 | Gunnam et al. | |
| 2008/0320214 A1 | 12/2008 | Ma et al. | |
| 2009/0027991 A1 | 1/2009 | Kaizu et al. | |
| 2009/0067320 A1 | 3/2009 | Rosenberg et al. | |
| 2009/0077302 A1 | 3/2009 | Fukuda | |
| 2009/0164694 A1 | 6/2009 | Talayco et al. | |
| 2009/0290441 A1 | 11/2009 | Gatzemeier et al. | |
| 2009/0296798 A1 | 12/2009 | Banna et al. | |
| 2009/0303788 A1 | 12/2009 | Roohparvar et al. | |
| 2009/0307412 A1 | 12/2009 | Yeh et al. | |
| 2009/0327802 A1 | 12/2009 | Fukutomi et al. | |
| 2010/0050056 A1* | 2/2010 | Kim | H03M 13/1515 714/776 |
| 2010/0085076 A1 | 4/2010 | Danilin et al. | |
| 2010/0162037 A1* | 6/2010 | Maule | G06F 11/106 714/5.11 |
| 2010/0162075 A1 | 6/2010 | Brannstrom et al. | |
| 2010/0185808 A1 | 7/2010 | Yu et al. | |
| 2010/0199149 A1 | 8/2010 | Weingarten et al. | |
| 2010/0211737 A1 | 8/2010 | Flynn et al. | |
| 2010/0211852 A1 | 8/2010 | Lee et al. | |
| 2010/0226422 A1 | 9/2010 | Taubin et al. | |
| 2010/0246664 A1 | 9/2010 | Citta et al. | |
| 2010/0262979 A1 | 10/2010 | Borchers et al. | |
| 2010/0293440 A1 | 11/2010 | Thatcher et al. | |
| 2011/0010602 A1 | 1/2011 | Chung et al. | |
| 2011/0055453 A1 | 3/2011 | Bennett et al. | |
| 2011/0055659 A1 | 3/2011 | Tu et al. | |
| 2011/0066902 A1 | 3/2011 | Sharon et al. | |
| 2011/0072331 A1 | 3/2011 | Sakaue et al. | |
| 2011/0096601 A1* | 4/2011 | Gavens | G11C 11/5628 365/185.09 |
| 2011/0119553 A1 | 5/2011 | Gunnam et al. | |
| 2011/0161678 A1 | 6/2011 | Niwa | |
| 2011/0209031 A1 | 8/2011 | Kim et al. | |
| 2011/0225341 A1 | 9/2011 | Satoh et al. | |
| 2011/0246136 A1 | 10/2011 | Haratsch et al. | |
| 2011/0246842 A1 | 10/2011 | Haratsch et al. | |
| 2011/0246853 A1 | 10/2011 | Kim et al. | |
| 2011/0296084 A1 | 12/2011 | Nango | |
| 2011/0299317 A1* | 12/2011 | Shaeffer | G11C 13/0002 365/106 |
| 2011/0307758 A1* | 12/2011 | Fillingim | G06F 11/1048 714/758 |
| 2012/0008396 A1 | 1/2012 | Park et al. | |
| 2012/0008666 A1* | 1/2012 | Roh | H03M 13/036 375/219 |
| 2012/0051144 A1 | 3/2012 | Weingarten et al. | |
| 2012/0054413 A1 | 3/2012 | Brandt | |
| 2012/0096192 A1 | 4/2012 | Tanaka et al. | |
| 2012/0140583 A1 | 6/2012 | Chung et al. | |
| 2012/0141139 A1 | 6/2012 | Bakhru et al. | |
| 2012/0166690 A1 | 6/2012 | Regula | |
| 2012/0167100 A1 | 6/2012 | Li et al. | |
| 2012/0179860 A1 | 7/2012 | Falanga et al. | |
| 2012/0203986 A1 | 8/2012 | Strasser et al. | |
| 2012/0239991 A1 | 9/2012 | Melik-Martirosian et al. | |
| 2012/0254515 A1 | 10/2012 | Melik-Martirosian et al. | |
| 2012/0311388 A1* | 12/2012 | Cronin | G06F 11/1004 714/42 |
| 2012/0311402 A1 | 12/2012 | Tseng et al. | |
| 2013/0013983 A1 | 1/2013 | Livshitz et al. | |
| 2013/0024735 A1 | 1/2013 | Chung et al. | |
| 2013/0060994 A1* | 3/2013 | Higgins | G06F 12/0246 711/103 |
| 2013/0086451 A1 | 4/2013 | Grube et al. | |
| 2013/0094286 A1 | 4/2013 | Sridharan et al. | |
| 2013/0094290 A1 | 4/2013 | Sridharan et al. | |
| 2013/0117616 A1 | 5/2013 | Tai et al. | |
| 2013/0117640 A1 | 5/2013 | Tai et al. | |
| 2013/0145235 A1 | 6/2013 | Alhussien et al. | |
| 2013/0148435 A1 | 6/2013 | Matsunaga | |
| 2013/0163327 A1 | 6/2013 | Karakulak et al. | |
| 2013/0163328 A1 | 6/2013 | Karakulak et al. | |
| 2013/0176779 A1 | 7/2013 | Chen et al. | |
| 2013/0185598 A1 | 7/2013 | Haratsch et al. | |
| 2013/0198451 A1 | 8/2013 | Hyun et al. | |
| 2013/0205085 A1 | 8/2013 | Hyun et al. | |
| 2013/0314988 A1 | 11/2013 | Desireddi et al. | |
| 2013/0315252 A1 | 11/2013 | Emmadi et al. | |
| 2013/0318422 A1 | 11/2013 | Weathers et al. | |
| 2014/0029336 A1 | 1/2014 | Venkitachalam et al. | |
| 2014/0040704 A1 | 2/2014 | Wu et al. | |
| 2014/0053037 A1 | 2/2014 | Wang et al. | |
| 2014/0068368 A1 | 3/2014 | Zhang et al. | |
| 2014/0068382 A1 | 3/2014 | Desireddi et al. | |
| 2014/0072056 A1 | 3/2014 | Fay | |
| 2014/0085982 A1 | 3/2014 | Asaoka et al. | |
| 2014/0101510 A1 | 4/2014 | Wang et al. | |
| 2014/0164881 A1 | 6/2014 | Chen et al. | |
| 2014/0181426 A1 | 6/2014 | Grunzke et al. | |
| 2014/0181617 A1 | 6/2014 | Wu et al. | |
| 2014/0185611 A1 | 7/2014 | Lie et al. | |
| 2014/0198569 A1 | 7/2014 | Kim et al. | |
| 2014/0198581 A1 | 7/2014 | Kim et al. | |
| 2014/0201590 A1* | 7/2014 | Coker | G11B 20/1217 714/758 |
| 2014/0215175 A1 | 7/2014 | Kasorla et al. | |
| 2014/0219003 A1* | 8/2014 | Ebsen | G11C 13/0004 365/148 |
| 2014/0229774 A1 | 8/2014 | Melik-Martirosian et al. | |
| 2014/0258590 A1 | 9/2014 | Kochar et al. | |
| 2014/0281767 A1 | 9/2014 | Alhussien et al. | |
| 2014/0281771 A1 | 9/2014 | Yoon et al. | |
| 2014/0281800 A1 | 9/2014 | Micheloni et al. | |
| 2014/0281808 A1 | 9/2014 | Lam et al. | |
| 2014/0281822 A1 | 9/2014 | Wu et al. | |
| 2014/0281823 A1 | 9/2014 | Micheloni et al. | |
| 2015/0039952 A1* | 2/2015 | Goessel | G06F 11/263 714/719 |
| 2015/0043286 A1 | 2/2015 | Park et al. | |
| 2015/0046625 A1 | 2/2015 | Peddle et al. | |
| 2015/0127883 A1 | 5/2015 | Chen et al. | |
| 2015/0131373 A1 | 5/2015 | Alhussien et al. | |
| 2015/0149871 A1 | 5/2015 | Chen et al. | |
| 2015/0169468 A1 | 6/2015 | Camp et al. | |
| 2015/0186055 A1 | 7/2015 | Darragh | |
| 2015/0221381 A1 | 8/2015 | Nam | |
| 2015/0242268 A1 | 8/2015 | Wu et al. | |
| 2015/0332780 A1 | 11/2015 | Kim et al. | |
| 2015/0371718 A1* | 12/2015 | Becker | G11C 29/14 714/718 |
| 2016/0034206 A1* | 2/2016 | Ryan | G11C 16/349 711/103 |
| 2016/0049203 A1 | 2/2016 | Alrod et al. | |
| 2016/0071601 A1 | 3/2016 | Shirakawa et al. | |
| 2016/0072527 A1 | 3/2016 | Tadokoro et al. | |
| 2016/0155507 A1 | 6/2016 | Grunzke | |
| 2016/0179406 A1 | 6/2016 | Gorobets et al. | |
| 2016/0247581 A1 | 8/2016 | Yoshida et al. | |
| 2016/0293259 A1 | 10/2016 | Kim et al. | |
| 2016/0342494 A1 | 11/2016 | Yang et al. | |
| 2016/0365158 A1 | 12/2016 | Yang | |
| 2017/0147135 A1 | 5/2017 | Higashibeppu | |
| 2017/0213597 A1 | 7/2017 | Micheloni et al. | |
| 2018/0033490 A1 | 2/2018 | Marelli et al. | |

OTHER PUBLICATIONS

NVM Express, revision 1.0; Intel Corporation; pp. 103-106 and 110-114; Jul. 12, 2011.

(56) References Cited

OTHER PUBLICATIONS

Cai, et al., "Data Retention in MLC NAND Flash Memory: Characterization, Optimization, and Recovery", 2015 IEEE 21st International Symposium on High Performance Computer Architecture (HPCA); Carnegie Mellon University, LSI Corporation, 2015, pp. 551-563.

Chen, et al., "Increasing flash memory lifetime by dynamic voltage allocation for constant mutual information", 2014 Information Theory and Applications Workshop (ITA), 2014, pp. 1-5.

Peleato, et al., "Probabilistic graphical model for flash memory programming", Statistical Signal Processing Workshop (SSP), 2012 IEEE, 2012, pp. 1-4.

Wu, et al., "Reducing SSD Read Latency via NAND Flash Program and Erase Suspension", Proceedings of FAST'2012; Department of Electrical and Computer Engineering Virginia Commonwealth University, Richmond, VA 23284, 2012, pp. 117-123.

\* cited by examiner

US 10,332,613 B1

NONVOLATILE MEMORY SYSTEM WITH RETENTION MONITOR

BACKGROUND

NAND-based flash memories are widely used as the solid-state memory storage due to their compactness, low power consumption, low cost, high data throughput and reliability. Solid state drive (SSD) devices commonly employ NAND-based flash memory chips and a flash controller to manage the flash memory and to transfer data between the flash memory and a host computer.

An issue for SSDs is the reliability of the storage elements over the life of the SSD. Over time, relatively high gate voltages applied to the storage elements during program and erase (P/E) cycles in the SSD may cause cumulative permanent changes to the storage element characteristics. Charge may become trapped in the gate oxide of the storage elements through stress-induced leakage current (SILC). As the charge accumulates, the effect of programming or erasing a storage element becomes less reliable and the overall endurance of the storage element decreases. Additionally, an increasing number of P/E cycles experienced by a storage element decreases the storage element's data retention capacity, as high voltage stress causes charge to be lost from the storage element's floating gate, resulting in increased Bit Error Rate (BER) of the memory storage device.

Design capabilities of SSD's are driven by application use cases. Consumer applications are driven primarily by cost, requiring low cost devices that can have limited endurance and limited retention, as long as a lifespan of a few years is obtained for a single-user usage model in which the SSD is operated for only a few hours a day. In contrast, enterprise applications require high reliability, high endurance and long service life. Some enterprise applications also require high retention. However, the factors dictating retention and endurance are related, allowing for varying specifications to accommodate specific use cases. For example, a SSD may have a write endurance of 10,000 cycles/block. By making the specification for retention less stringent, write endurance can be extended. In transaction-oriented applications, where data retention of a few weeks is acceptable, block write endurance can be extended to more than 10,000 cycles/block.

Accordingly it is important to be able to accurately determine both write endurance and retention. Prior art models for determine retention capabilities of NAND-based flash memory chips are typically based on delta read calculations and the assumption that delta read is monotonic. However, with scaled NAND geometries, delta read is not monotonic. Delta read can be both positive and negative for a particular retention time. Accordingly, prior art models based on the assumption that delta read are based on an incorrect assumption. This can lead to incorrect estimation of retention values for a particular NAND Device.

Accordingly, what is needed in the art is a method and apparatus that will allow for accurately determining retention capabilities of NAND-Flash devices and SSD's and assuring that NAND-Flash devices and SSD's maintain the determined retention capabilities.

SUMMARY

In various embodiments, a nonvolatile memory system is disclosed that includes a nonvolatile memory storage module for storing encoded data and a nonvolatile memory controller. The nonvolatile memory storage module includes a plurality of memory cells that are controlled by the nonvolatile memory controller. The nonvolatile memory controller includes a retention monitor that is configured for storing test characteristics corresponding to a use case and determining, each time that a read of a codeword is performed, whether the number of errors in the codeword exceed a retention threshold. If the number of errors in the codeword exceed the retention threshold, the block that includes the codeword that exceeds the retention threshold is retired. Retention tests are performed during the operation of the memory controller and the retention threshold is adjusted when the results of the retention tests indicate deviation from the test characteristics corresponding to a use case.

A method for assuring retention is disclosed that includes storing test characteristics corresponding to a use case and, each time that a read of a codeword of a nonvolatile memory device is performed by the controller, determining the number of errors in the codeword. Each time that a read of a codeword of a nonvolatile memory device is performed by the controller, the method includes determining whether the number of errors in the codeword exceed a retention threshold and, if the number of errors in the codeword exceed the retention threshold, retiring the block of the nonvolatile memory device that includes the codeword that exceeds the retention threshold. The method further includes performing retention tests during the operation of the memory controller and adjusting the retention threshold when the results of the retention tests indicate deviation from the test characteristics corresponding to a use case.

The method and apparatus of the present invention allow for assuring a level of retention can be maintained over the life of the nonvolatile memory devices.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1:
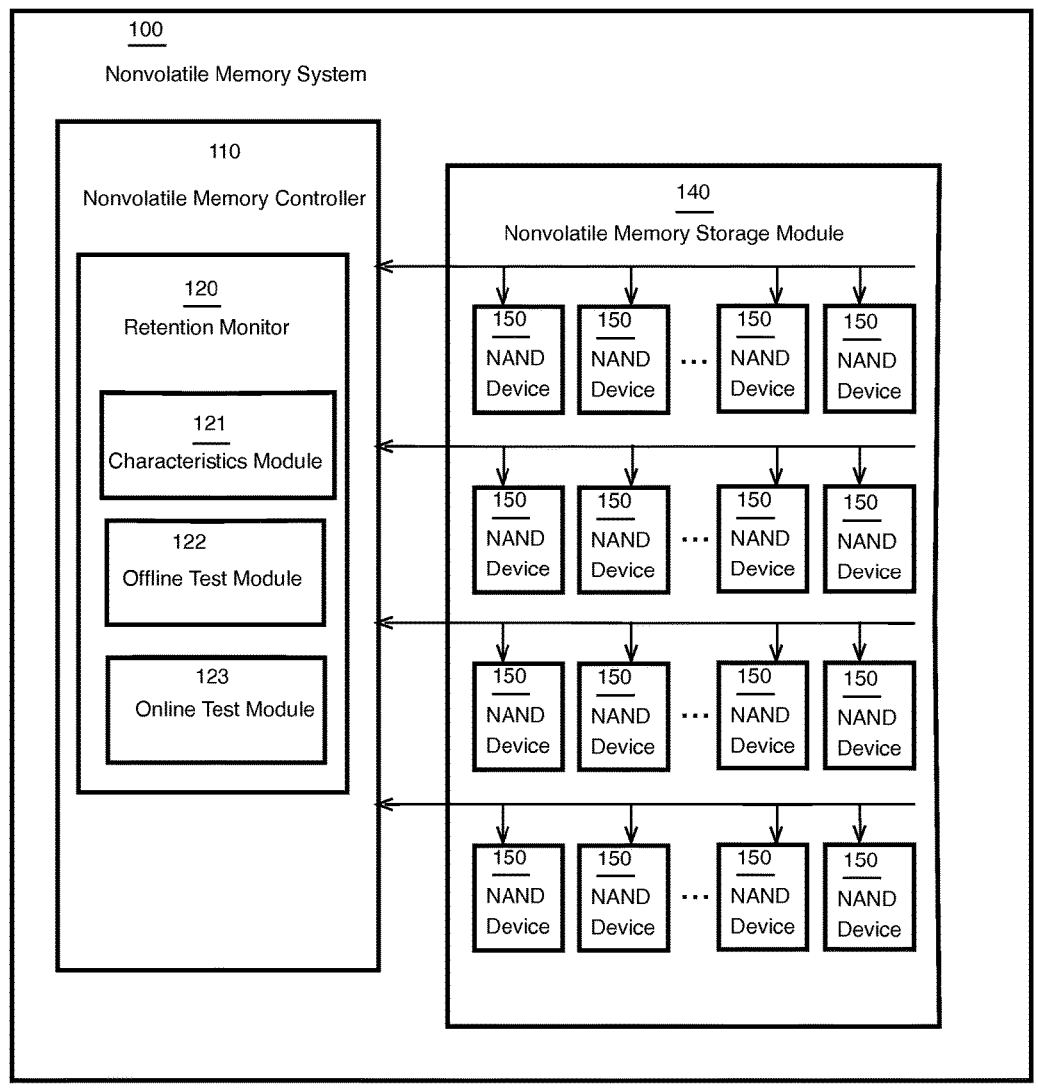
FIG. 1 is a block diagram illustrating a nonvolatile memory system in accordance with an embodiment of the present invention.

A nonvolatile memory system 100 is shown in FIG. 1 to include a nonvolatile memory controller 110 in communication with a nonvolatile memory storage module 140. The nonvolatile memory storage module 140 includes a plurality of nonvolatile memory devices for storing data. In the present embodiment the nonvolatile memory devices are NAND devices 150. In the present embodiment each NAND device 150 is a packaged semiconductor die that is coupled to nonvolatile memory controller 110 by conductive pathways that couple instructions, data and other information between each NAND device 150 and nonvolatile memory controller 110. The nonvolatile memory controller 110 includes a retention monitor 120. Retention monitor 120 includes a characteristics module 121 that is configured to store test characteristics corresponding to one or more use case. In one embodiment the test characteristics are stored in memory storage on nonvolatile memory controller 110. Alternatively, the test characteristics can be stored in one or more NAND devices 150.

Retention monitor 120 is operable for determining, each time that a read of a codeword is performed, whether the number of errors in the codeword exceed a retention threshold, and if the number of errors in the codeword exceed the retention threshold, retiring the block of the nonvolatile memory device that includes the codeword that exceeds the retention threshold. Retention monitor 120 is also operable for performing retention tests during the operation of the memory controller and adjusting the retention threshold when the results of the retention tests indicate deviation from the test characteristics corresponding to a use case. Retention monitor 120 includes an online test module 123 that is configured to perform online testing and an offline test module 122 that is configured to perform testing on the results of the offline retention.

In one exemplary embodiment each NAND device 150 is coupled to nonvolatile memory controller 110 by chip enable line (CE#), a command latch enable (CLE) line, a read enable signal line (RE#), an address latch enable (ALE) signal line, a write enable single line (WE#), a read/busy (RB) signal line and input and output (I/O) signal lines.

Figure 2:
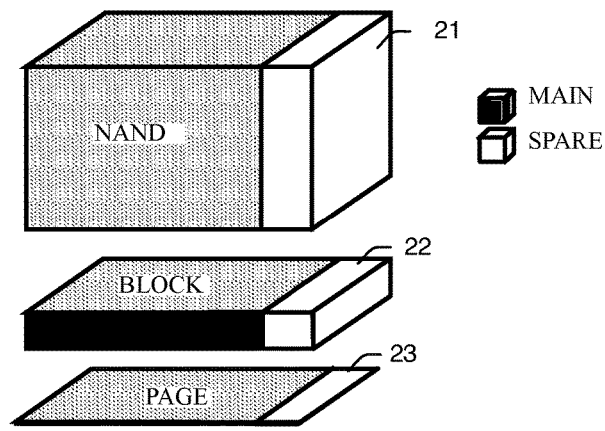
FIG. 2 is block diagram illustrating a memory logic organization in accordance with an embodiment of the present invention.

Referring now to FIG. 2, each NAND device 21 includes memory cells that are organized into blocks 22 and pages 23, with each block 22 composed of NAND strings that share the same group of word lines. A logical page 23 is composed of cells belonging to the same word line. The number of logical pages 23 within logical block 22 is typically a multiple of 16 (e.g. 64, 128). Each logical page 23 is composed of a main data area and a spare area. The main data area may have the size of 4 kB, 8 kB, 16 kB or larger. The spare area is made up of hundreds of bytes for every 4 kB of main data storage area.

In the present embodiment, a logical page 23 is the smallest addressable unit for reading from and writing to the NAND memory and a logical block 22 is the smallest erasable unit. However, it is appreciated that in embodiments of the present invention programming to less than an entire page may be possible, depending on the structure of the NAND array.

Figure 3:
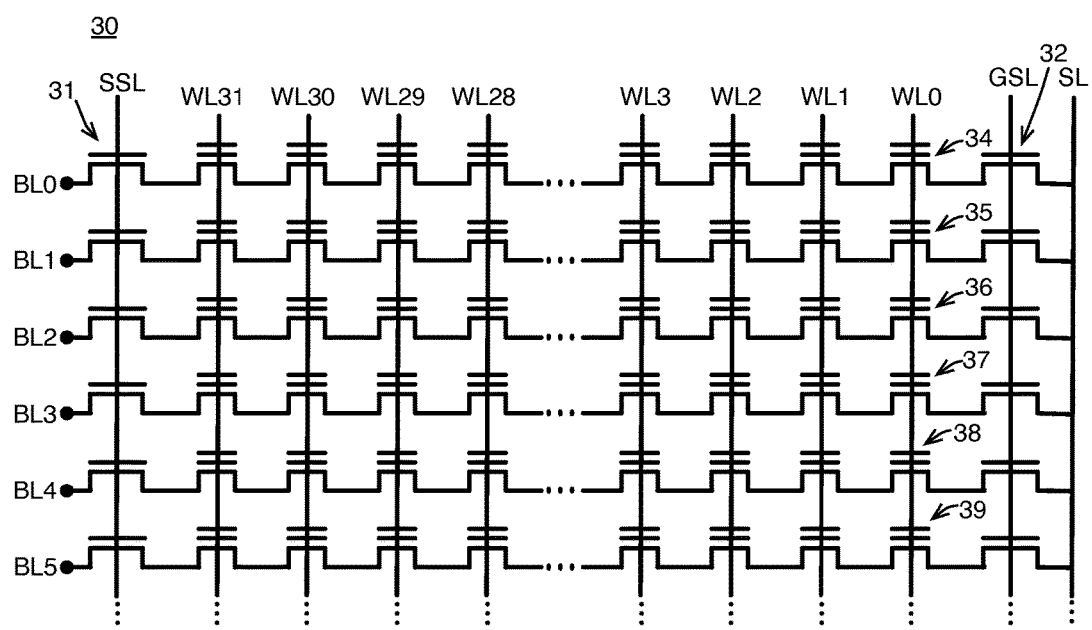
FIG. 3 is a diagram illustrating a NAND array in accordance with an embodiment of the present invention.

An exemplary NAND array 30 is shown in FIG. 3 that is made of memory cells connected in series to form NAND strings. Each NAND string is isolated from the rest of the array by select transistors, such as, for example, select transistor 31 and select transistor 32. Multiple memory cells share the gate voltage (Vg) through a word line, and the drain of one memory cell is the source of the adjacent one. For example, memory cells 34-39 of FIG. 3 share word line 0 (WL0). Though FIG. 2 illustrates an embodiment in which memory cells are single level cells, it is appreciated that NAND devices 150 can also be multi-level cell NAND devices and can store, for example, 2 bits per cell, 3 bits per cell or 4 bits per cell.

Figure 4:
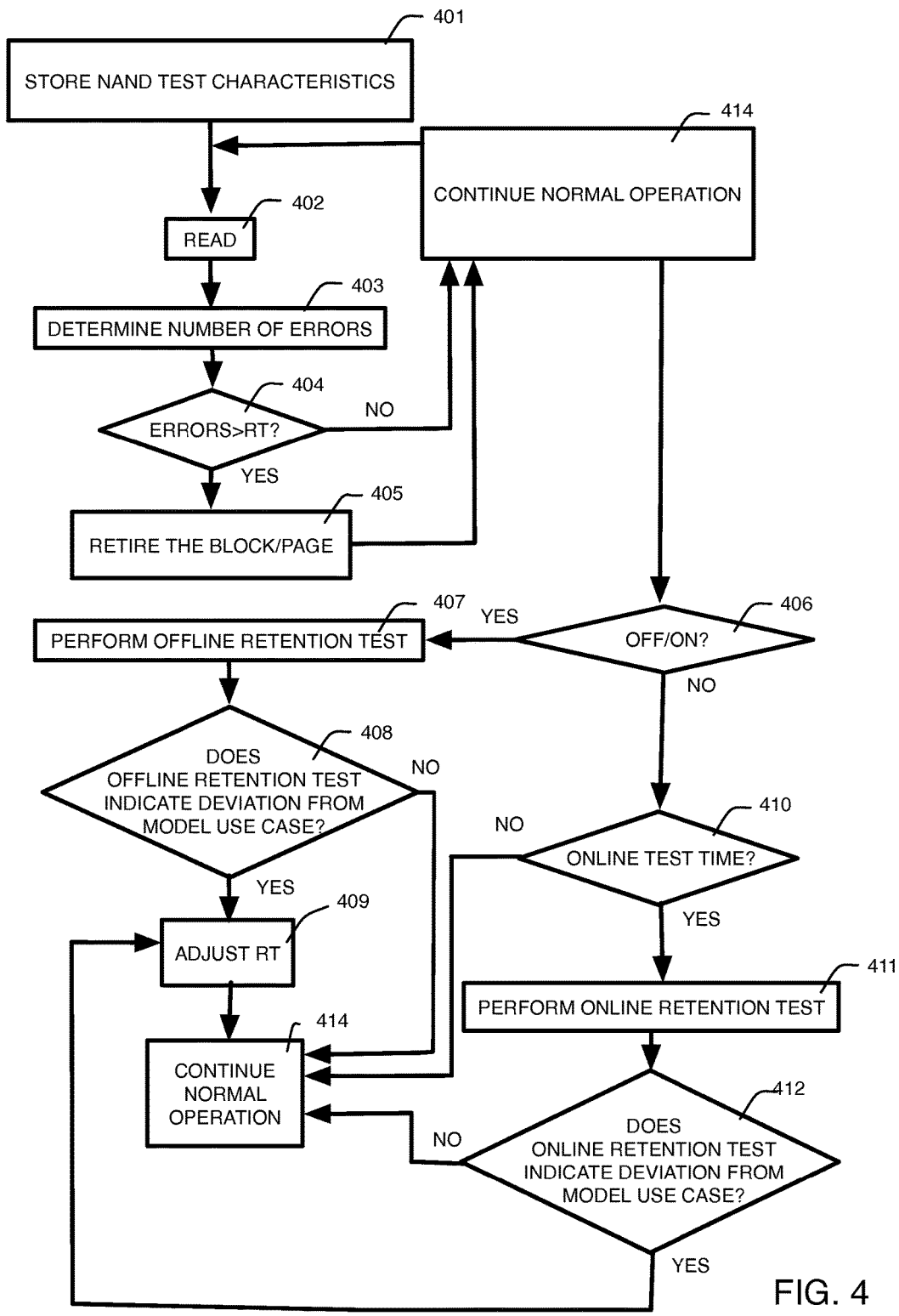
FIG. 4 is a flow diagram illustrating a method for assuring retention of nonvolatile memory devices coupled to a memory controller in accordance with the present invention.

FIG. 4 illustrates a method 400 for assuring retention that includes storing test characteristics corresponding to a use case 401. In the present embodiment characteristics module 121 is configured to store test characteristics, either in memory storage on nonvolatile memory controller 110 or in one or more NAND device 150. In one embodiment test characteristics module 121 is also operable to store test codewords to be read in online and offline retention testing.

As shown by step 402-403, each time that a read of a codeword is performed, the number of errors in the codeword are determined. A determination is then made 404 as to whether the number of errors in the codeword exceed a retention threshold (RT) and if the number of errors in the codeword exceed the retention threshold, the block of the nonvolatile memory device that includes the codeword that exceeds the retention threshold is retired as shown by steps 404-405. Alternatively, when the number of errors in the codeword exceed a retention threshold (RT) and if the number of errors in the codeword exceed the retention threshold, the page of the nonvolatile memory device that includes the codeword that exceeds the retention threshold is retired.

As shown by step 406-412 retention tests are performed during the operation of nonvolatile memory controller 110. As shown by step 408-409 and 412 the retention threshold is adjusted when the results of the retention tests indicate deviation from the test characteristics corresponding to a use case.

In the present embodiment the retention tests include both offline retention tests 407 and online retention tests 411. Alternately, only offline retention testing 407 or only online retention testing 411 could be used for adjusting the retention threshold 409.

In the present embodiment, offline retention tests are performed 407 when the memory controller is being shut off and when it is turned back on as shown by steps 406-407. In the present embodiment a first portion of the offline retention test 407 is performed as the memory controller is shut down (e.g., as a part of the shut-down process) and a second part of the offline retention test 407 is performed as the memory controller is restarted (e.g., as a part of the power-on-start-up process) in the next start-up of the nonvolatile memory controller 110.

As shown by steps 408-409 the retention threshold is adjusted 409 when the result of the offline retention test indicates deviation from an online test characteristic corresponding to a model use case 408.

Online retention tests 411 are performed during normal operation nonvolatile memory controller 110 at certain times 410, which may be regular intervals of time such as hourly, daily, weekly, monthly or after a predetermined number of operating hours. In one exemplary embodiment, online retention tests 411 are performed after every 12 operating hours of nonvolatile memory controller 110.

When the results of the online retention test indicate deviation from online test characteristics corresponding to a model use case 412 the retention threshold is adjusted 409.

When a read is not being performed, when the number of errors is not greater than the retention threshold 404, and after retiring the block 405 normal operation of the nonvolatile memory controller is continued 414. Also, when online retention test does not indicate deviation from a model use case and offline retention test does not indicate deviation from a model use case and after adjusting the retention threshold 409 normal operation is continued 414.

Figure 5:
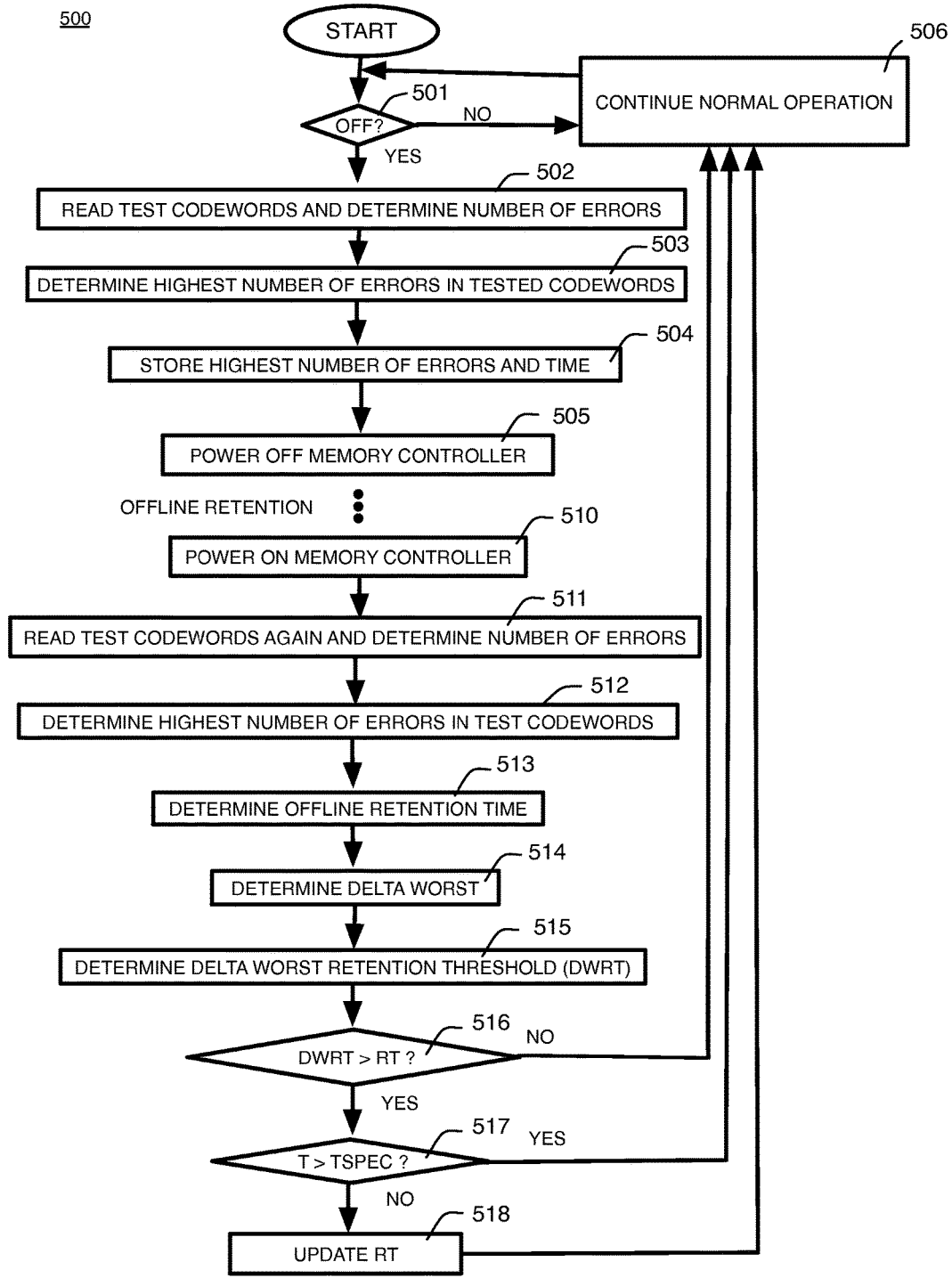
FIG. 5 is a flow diagram illustrating an offline retention test and updating the retention threshold when a calculated DeltaWorst retention threshold exceeds the current retention threshold in accordance with an embodiment of the present invention.

FIG. 5 illustrates an embodiment of steps 407-409 of FIG. 4. More particularly a method 500 is illustrated for performing an offline retention test and updating a retention threshold in accordance with an embodiment of the invention. In one embodiment some or all of the steps of method 500 are performed by offline test module 122. As shown by step 501 when a power-off indication is received test codewords are read and the number of errors in each codeword is determined 502. In the present embodiment test codewords are one or more pages that are dedicated to storing data for retention testing. In one embodiment each test codeword is a logical page. Alternatively, a page may contain more than test codeword. The number of test codewords read in step 502 may be as few as two to three or as many as two to three codewords in each block of each NAND device 150. In one exemplary embodiment only three codewords are read so as to keep shutdown time to a minimum. In another embodiment a page of each block of each NAND device 150 is read.

As shown by step 503 the highest number of errors in the tested codewords is determined. More particularly, the number of errors in the codeword having the highest number of errors is determined. The highest number of errors can also be referred to as the "worst number of errors". In one embodiment the highest number of errors is determined by initializing a highest number of errors value at 0 and comparing the number of errors in each codeword read in step 502 to the highest number of errors value. If the errors in a codeword exceed the highest number of errors value, the highest number of errors value is replaced by the number of errors in the codeword having a number of errors exceeding the highest number of errors value. The highest number of errors value is then stored as shown by step 505. In one embodiment the highest number of errors is stored in nonvolatile memory controller 110 or on a NAND device 21 prior to powering off the nonvolatile memory controller 110. In the present embodiment the time at which test codewords 502 were read is determined and is stored along with the highest number of errors. The stored time, that can be referred to as initial time ($t_1$) can be the time that the codeword having the highest number of errors was read. Alternatively, the time can be the time that the read operation of step 502 commenced or ended. The initial time may be determined by setting a timing device to an initial time of 0. Alternatively, the initial time may be determined by determining the time of an internal or external clock, e.g., a time $t_{REF1}$ of an internal or external reference clock that is not reset to a time of 0.

The nonvolatile memory controller is then powered off as shown by step 505.

After powering-on the nonvolatile memory controller at a subsequent time 510, the codewords that were read in step 502 are again read as shown by step 511 and the number of errors in each codeword is determined as each codeword is decoded. In embodiments in which all of the active codewords are read on startup to refresh active memory pages, the reading of step 511 is integrated into the startup-refresh process so as to provide a quick startup of the nonvolatile memory controller 110.

The number of errors in the codeword having the highest number of errors (at the subsequent time) is determined 512. In one embodiment the highest number of errors is determined by initializing an after-offline-retention-highest number of errors value at 0 and comparing the number of errors in each codeword read in step 511 to the after-offline-retention-highest number of errors value. If the errors in a codeword exceed the after-offline-retention-highest number of errors value, the after-offline-retention-highest number of errors value is replaced by the number of errors in the codeword. The after-offline-retention-highest number of errors value may then be stored along with the time of the reading of the codeword having the highest number of errors in step 511, that can be referred to as the subsequent read time ($t_2$).

The offline retention time t is then determined 513. In the embodiment in which the timing device is initialized to a time of 0 at step 502, the time indicated by the timing device at step 512 is the offline retention time (t). It is appreciated that offline retention time t is the relative time period between the initial offline retention time of step 502 and the offline retention time of step 511, and that memory controllers do not typically include timing devices that are operable during power-off. As previously discussed, nonvolatile memory controller may include offline timer that is operable during power-off.

In one embodiment when a power-off signal is received, nonvolatile memory controller 110 does not completely power-off but rather enters a low power mode in which certain modules are operable such as the offline timer. In this mode all NAND memory devices are powered off and nonvolatile memory controller 110 returns to full-power mode when a power-on signal or start-up signal is received or when power is applied to one or more power pin of nonvolatile memory controller 110.

Alternatively time is measured using a system clock or other timing resource external to the nonvolatile memory controller. In these embodiments the time of the read of step 511 is determined ($T_{REF2}$) and the read time ($T_{REF1}$) of step 502 is subtracted from $T_{REF2}$ of step 511 to obtain the subsequent read time (offline retention time=t).

Referring now to step 514, a delta worst (ΔWorst) value is calculated by subtracting the number of errors in the codeword having the highest number of errors from step 504 Worst(0) from the number of errors in the codeword having the highest number of errors from step 512 Worst(t) and can be represented by the equation:

$$\Delta \text{Worst}(t) = \text{Worst}(t) - \text{Worst}(0)$$

where t represents offline time.

As shown by step 515 a delta worst retention threshold (DWRT) is determined. In the present embodiment the delta worst retention threshold is determined by subtracting delta worst determined in step 514 from the maximum error correction capacity of the error correction code used to generate the codewords ($ECC_{MAX}$) and can be represented by the equation:

$$\text{DWRT} = ECC_{MAX} - \Delta \text{Worst}(t).$$

The retention threshold is updated if the delta worst retention threshold exceeds the retention threshold 516. The retention threshold is initially set at a characteristic retention threshold ($RT_{CHAR}$) that was stored in step 401. Accordingly, the retention threshold is updated if the delta worst retention threshold exceeds the characteristic retention threshold.

In the present embodiment a determination is made as to whether the offline retention time determined in step 513 is within specification and when the retention time is above the specification retention time the retention time is not updated in step 518. In one embodiment a specification retention time Tspec is stored in step 401 for use in step 517.

It is appreciated that step 517 is optional and that, in embodiments that do not include step 517, the retention threshold is updated in step 518 even when the offline retention time exceeds the specification retention time.

In the present embodiment the retention threshold is updated 518 by replacing the retention threshold with the delta worst retention threshold determined in step 515 when the delta worst retention threshold of step 515 exceeds the retention threshold. Accordingly, the retention threshold is initially updated if the delta worst retention threshold exceeds the characteristic retention threshold. After the initial update in which the characteristic retention threshold is used to determine whether the offline retention test indicates deviation from the model use case, subsequent comparisons in step 516 are based on a previous delta worst retention threshold calculated in step 515 or an update based on online retention, which is further discussed in step 607.

Though the test codewords read in steps 502 and 511 may be codewords stored in NAND devices 150 for the exclusive purpose of retention testing, alternatively, any codeword could be chosen as a test codeword for offline retention testing. In this embodiment test codewords read in steps 502 and 511 are selected from the active codewords stored in NAND devices 150.

Figure 6:
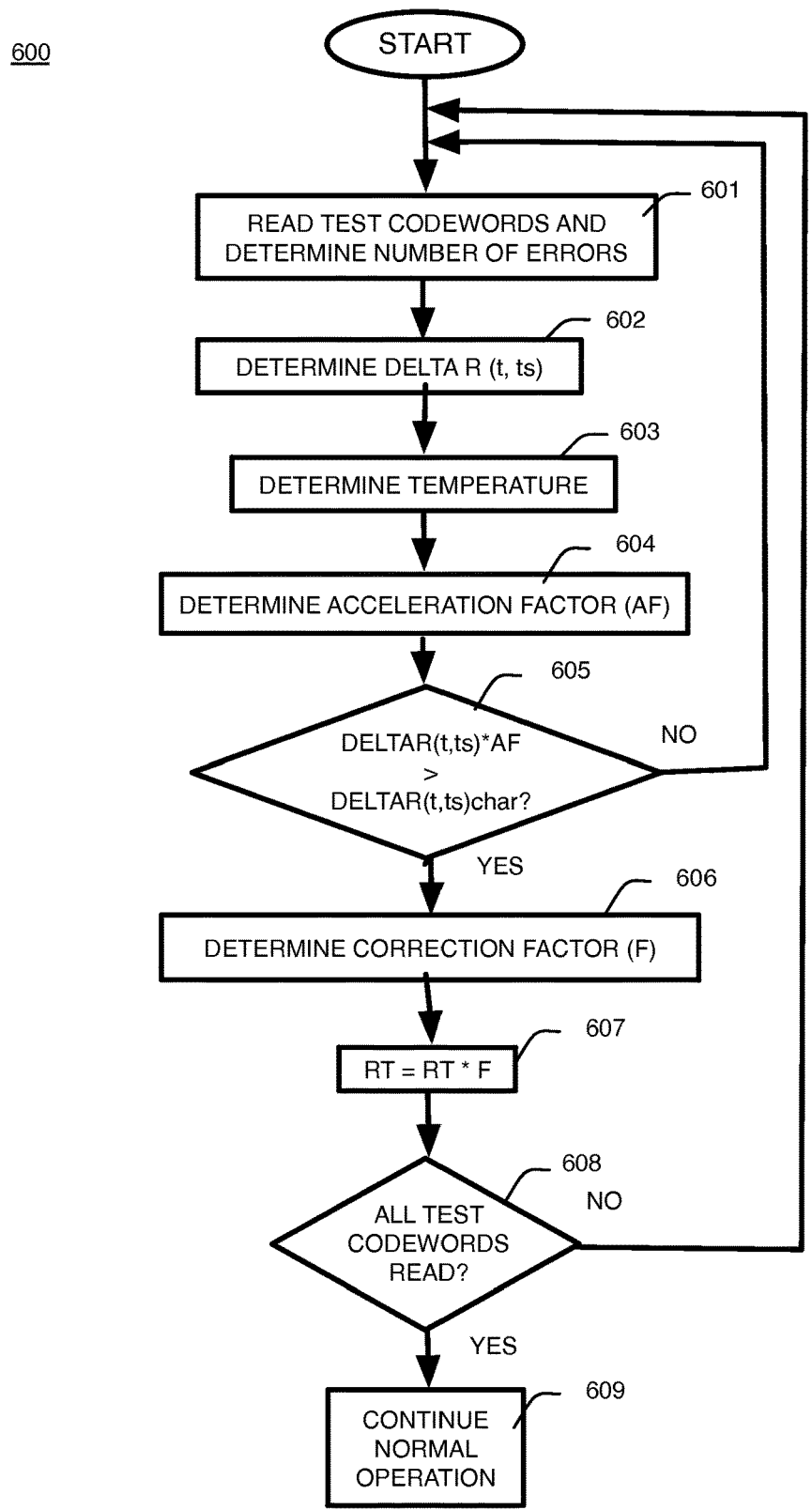
FIG. 6 is a flow diagram illustrating an online retention test and updating the retention threshold when a calculated $\Delta R(t,ts)$ multiplied by an acceleration factor exceeds $\Delta R(t,ts)_{CHAR}$ in accordance with an embodiment of the present invention.

FIG. 6 illustrates an embodiment of steps 410-412 and 414. More particularly, method 600 illustrates a method for performing an online retention test and updating a retention threshold. In one embodiment some or all of the steps of method 600 are performed by online test module 123. As shown by step 601 test codewords are read and the number of errors is determined for each codeword that is read. In the present embodiment test codewords are one or more pages that are dedicated to storing data for retention testing. In one embodiment each test codeword is a logical page. Alternatively, a page may contain more than test codeword. The number of test codewords read in step 601 may be as few as two to three or as many as an entire block of each NAND device 150. In one exemplary embodiment each codeword is a logical page and step 601 reads all of the pages of a dedicated test block of a single NAND device 150.

The read 601 is performed on a regular basis an interval is that may be, for example, 12, 24, 36 or 48 hours. In the present embodiment read 601 is performed every 12 operating hours of nonvolatile memory controller 110.

Marginal error rate is determined 602 for the codewords read in step 601. In one embodiment marginal error rate, that can also be referred to as Delta Read and ΔR(t,ts) is determined by subtracting the number of errors at time (t) from the number of errors at the following interval (t+ts) as is illustrated by the equation:

$$\Delta R(t,ts) = \#\text{Errors}(t+ts) - \#\text{Errors}(t).$$

In one embodiment, each time that the test codewords are read in step 601, the number of errors are stored for use in the following calculation of marginal error rate.

Temperature is determined as shown by step 603. In the present embodiment nonvolatile memory controller 110 includes a temperature sensor that is operable for determining the temperature of the nonvolatile memory controller at the time of the test.

There is feedback between online and offline parameters to as to enable a cross-correlation between them. Because temperatures can be different between online and offline periods (and they usually are) an acceleration factor (AF) is used to normalize measured retention errors. More particularly, as shown by step 604, an acceleration factor is determined that corresponds to the temperature determined in step 603. In the present embodiment the acceleration factor is determined using conventional methodology such as, for example, the Arrhenius equation.

As shown by step 605-607 the retention threshold is updated if the determined marginal error rate multiplied by the acceleration factor exceed a characterized marginal error rate. More particularly, the marginal error rate (ΔR(t,ts)) determined in step 602 is multiplied by the acceleration factor (AF) determined in step 603 and the results are compared to a corresponding characterized marginal error rate ($\Delta R(t,ts)_{CHAR}$).

In the present embodiment the test characteristics stored in step 401 include a plurality of characterized marginal error rates. In one embodiment a table is stored that includes characterized marginal error rates for each test time (t) for the particular testing interval (ts). In one embodiment a characterized marginal error rate is stored for each test time (t). Alternatively, to save storage space, a characterized marginal error rate may be used for more than one different test time (t). For example, though the testing of steps 601-607 may be done daily, a single characterized marginal error rate may be used for testing during a time interval, such as, for example, using a single characterized marginal error rate during all tests within a given week or month or specific operating hours.

In the embodiment shown in FIG. 6, the retention threshold is updated 606-607 using a correction factor (f). First, the correction factor is determined as shown by step 606. In one embodiment the correction factor is determined using the equation:

$$f = |\Delta R(t,ts)*AF - \Delta R(t,ts)_{CHAR}|*\alpha$$

where α>1 if $\Delta R(t,ts)*AF > \Delta R(t,ts)_{CHAR}$. Otherwise α≤1.

In the present embodiment the test characteristics stored in step 401 include one or more correction factor characterization value α. In one embodiment only a single correction factor characterization value α is stored. In another embodiment a plurality of correction factor characterization values α are stored and the correction factor characterization value α to be used to update the retention threshold is chosen based on the use case.

Correction factor characterization value α is a fitting parameter that is determined by testing NAND test chips and looking at how errors evolve over time, focusing on ECC codewords that deviate from the typical behavior. For example, when ts is 12 hours the testing can look at how many additional errors develop in a 12 hour period. More particularly, the testing could indicate that, on the average 20% more errors result. Single correction factor characterization value α is not an absolute value but rather it scales with the absolute number of errors coming from the read operation. Accordingly, depending on the use case, a single value may be sufficient for the life of nonvolatile memory system 100. However, in other use cases multiple values of α are used, with a different α used after a predetermined number of P/E cycles have occurred or after a predetermined number of read cycles have occurred. In these embodiments a table is stored in step 401 that includes the α values and the index to be used for selecting the appropriate α value (e.g., number of P/E cycles or read cycles).

The retention threshold is updated 607 by multiplying the current retention threshold by the correction factor determined in step 606 and storing the results as the new correction factor.

The testing of steps 601-607 proceeds until all test codewords have been read 608. The test then ends and normal operation continues as shown by step 609.

Accordingly, the amount of correction corresponds to the variance between the online retention tests and the expected results, providing an updated retention threshold that has been corrected in proportion to the deviation between the calculated marginal error rate and the characterized marginal error rate.

FIGS. 7-12 illustrate the results of an exemplary test of a sample NAND device and illustrate the calculation of $RT_{CHAR}$ and $\Delta R(t,ts)_{CHAR}$. In the test, codewords are stored in blocks of a test NAND device and are read at a time period (ts) and the number of errors in each codeword is determined.

Figure 7:
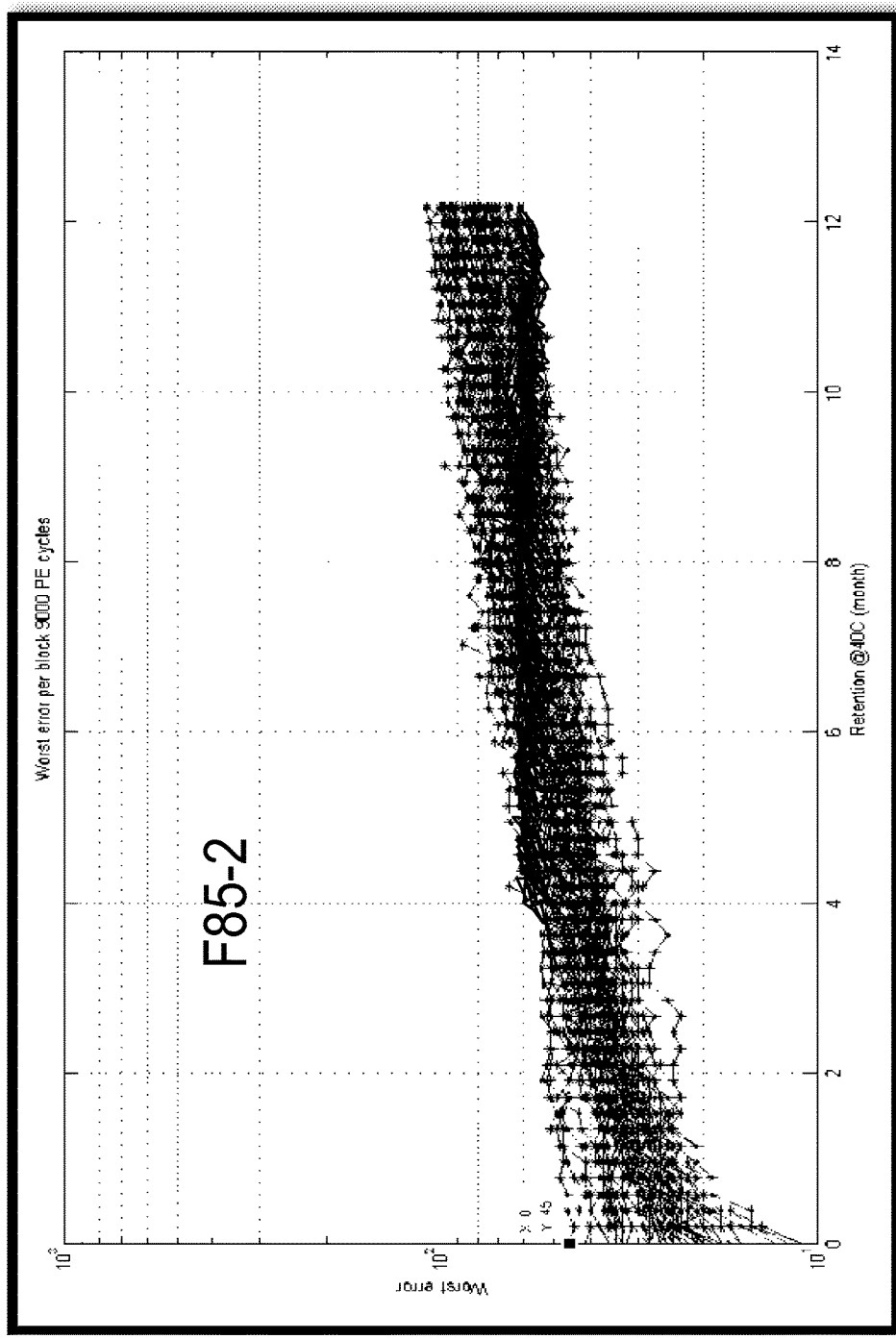
FIG. 7 is a diagram illustrating test results for a test NAND device during retention, showing the number of errors on the vertical axis and retention time on the horizontal axis with the worst number of errors in each block plotted for a particular use case in accordance with an embodiment of the invention.

FIG. 7 shows errors on the vertical axis and retention time on the horizontal axis and shows the highest error in each block as a function of retention time. In this specific example the time period ts is daily and the test is performed at a temperature of 85 degrees (F-85-2).

Following is an exemplary illustration as to how a characteristic retention threshold can be determined. In the present embodiment the first time represents the start of the test and is performed at a time (t=0). First, the number of errors in the codeword having the highest number of errors at an initial offline time (t=0) are determined. At the start of the test the codeword having the highest number of errors Worst(0) has 45 errors.

In this example, when the target retention time is 5 months, t=5 months and the highest number of errors Worst(t)=66. Using the equation ΔWorst(t)=Worst(t)−Worst(0) gives a ΔWorst(t=5 mo.)=21 errors.

Figure 8:
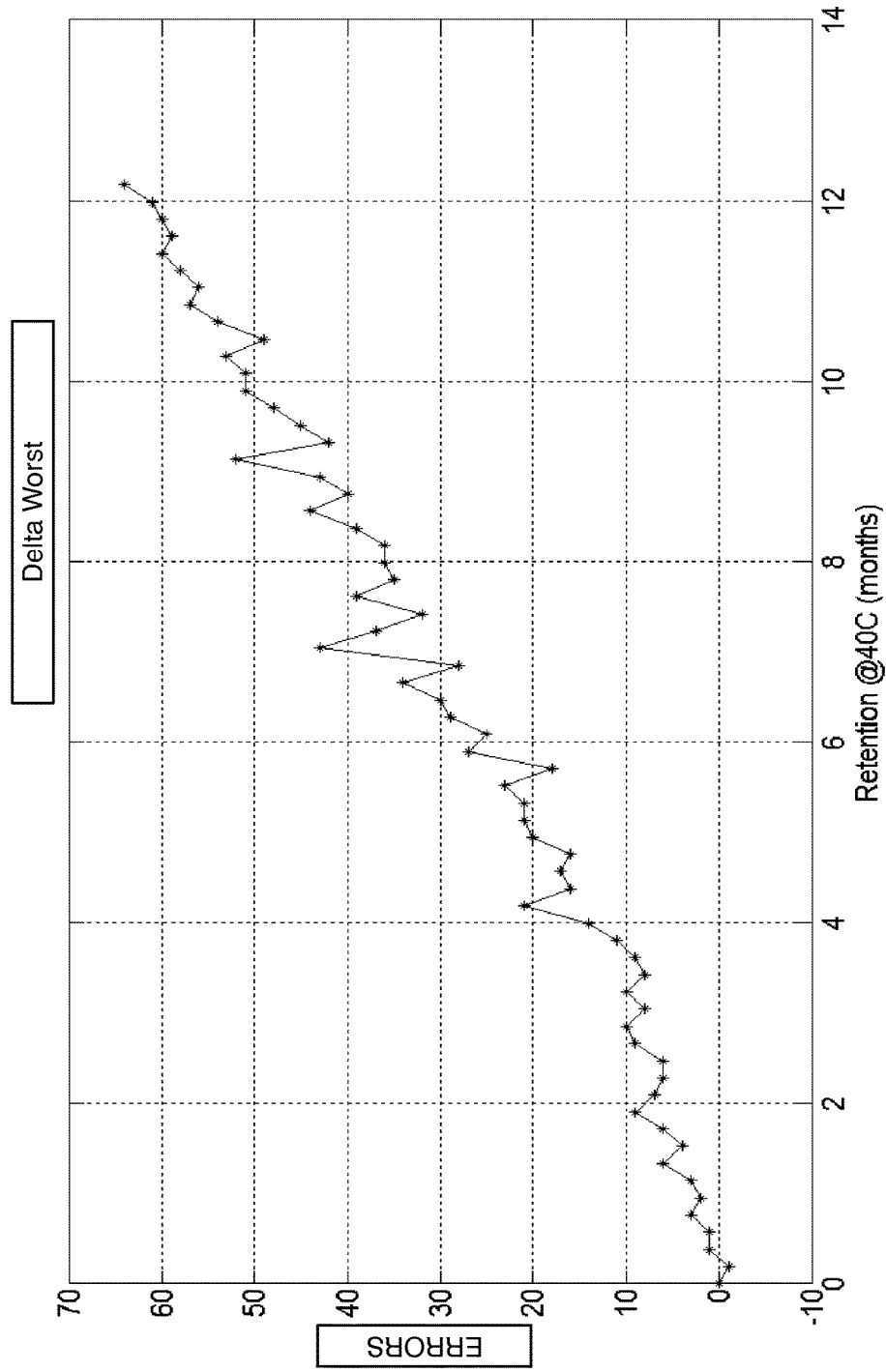
FIG. 8 is a diagram having a vertical axis representing the number of errors and a horizontal axis representing retention time and shows DeltaWorst for the use case shown in FIG. 7 in accordance with an embodiment of the invention.

FIG. 8 shows an exemplary plot of ΔWorst for the tested NAND devices tested in FIG. 7. It can be seen that ΔWorst increases with retention time.

When the maximum error correction capacity of the error correction code used to generate the codewords ($ECC_{MAX}$) is 100, the DeltaWorst retention threshold can be calculated using the equation: $DWRT = ECC_{MAX} - \Delta Worst(t_O=5$ mo.) which gives a DWRT of 79.

The DWRT to be used for characterizing the NAND device may be reduced to account for statistical variations (die-to-die or intra-die). In one embodiment an additional margin (MM) is subtracted from DWRT to account for manufacturing variability. In one embodiment the ΔWorst is determined for a retention time that is greater than the target retention time. In one embodiment an additional month is added to the retention time. For example, adding one month gives 6 months retention. Referring now to FIGS. 6 and 7 it can be seen that this gives a ΔWorst+MM=27 and a corresponding Delta Worst Retention Threshold Characterization value ($DWRT_{CHAR}$) of 73 errors.

Figure 9:
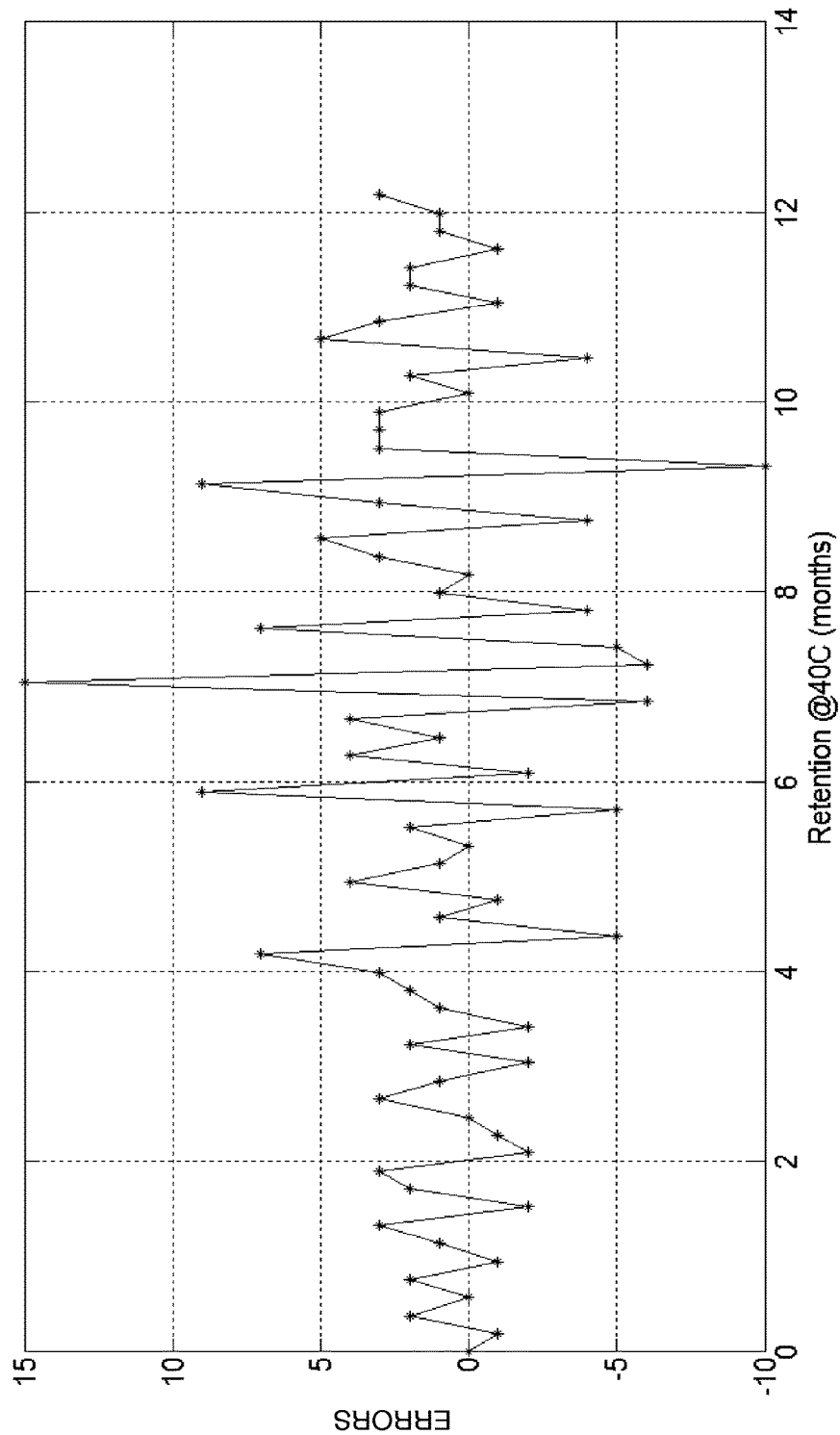
FIG. 9 is a diagram having a vertical axis representing the number of errors and a horizontal axis representing retention time and shows Delta-DeltaWorst for the use case shown in FIG. 7 in accordance with an embodiment of the invention.

In another embodiment the additional margin to be subtracted from to account for statistical variation is determined by calculating the change between successive calculations of ΔWorst that can be referred to as Delta-DeltaWorst or ΔΔWorst. Delta-DeltaWorst can be determined using the equation ΔΔWorst=ΔWorst(t+ts)−ΔWorst(t). FIG. 9. shows ΔΔWorst for the ΔWorst values shown in FIG. 7. In one embodiment the additional margin is the greatest value of ΔΔWorst in a given time period. For example, in one embodiment a time period of between one month prior to the target retention time and one month after the target retention time is used and the highest ΔΔWorst in that time period is used as the additional margin. In the embodiment shown in FIG. 9, the highest ΔΔWorst between four months and six months is 9. Subtracting 9 to the calculated DWRT of 79 gives a Delta Worst Retention Threshold Characterization value ($DWRT_{CHAR}$) of 70 errors.

The retention threshold of the present invention is a function of the use case at given retention time. The methods and apparatus of the present invention are available to track how he flash NAND devices age while the SSD is active. The threshold is a function of ts. Accordingly, a different retention threshold is set depending on how frequently correctability is checked. In fact, the longer the ts, the lower the retention threshold should be.

It has been found that there is a feedback between online and offline parameters so as to enable a cross-correlation between the two. Because temperatures could be different between online and offline periods an acceleration factor AF is used to normalize measurement retention errors. Temperature is monitored by the controller and is an input value to the algorithm.

Figure 10:
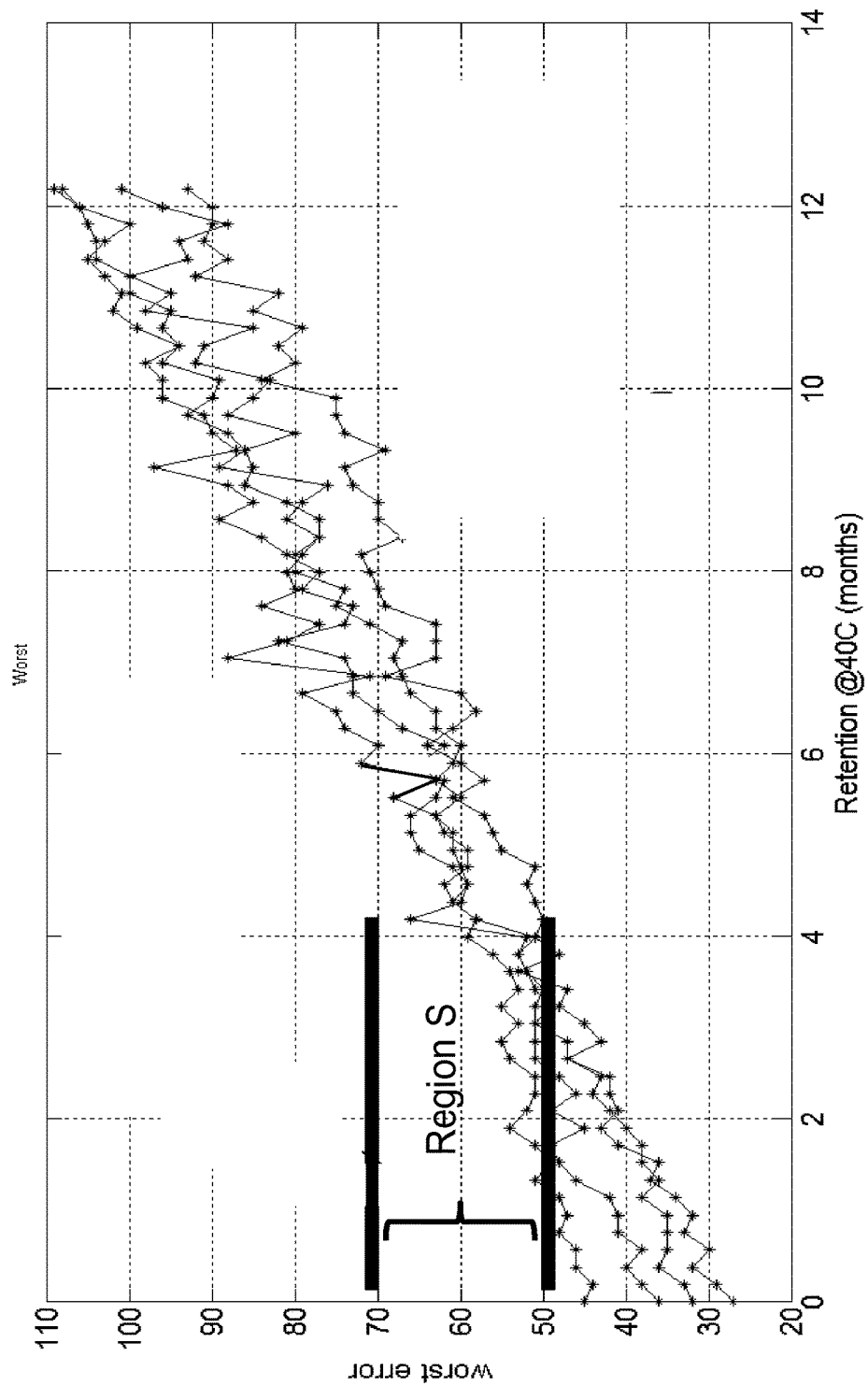
FIG. 10 is a diagram illustrating test results for a test NAND device during retention, showing the number of errors on the vertical axis and retention time on the horizontal axis with the worst number of errors in each block plotted for a use case in accordance with an embodiment of the invention.

FIG. 10 shows an embodiment in which four blocks are tested, with the highest number of errors in each block plotted. Thus, the vertical axis shows the worst number of errors in each block and the horizontal axis shows retention time in months. FIG. 10 illustrates a DeltaWorst retention threshold of 70 and highlights the issue of worst-error plots having a steep slope. When the worst-error plots have a steep slope, the difference between the worst error in any codeword and the $DWRT_{CHAR}$ of 70, marked as Region S, is relatively large at an early retention time. Codewords starting in Region S were not a part of the characterization batch and their behavior was not measured. The issue is, to what extent should codewords starting in Region S be allowed? One way to deal with this issue is to further reduce the ΔWorst retention threshold. In one embodiment the ΔWorst retention threshold is reduced by an additional 3 errors, producing a $DWRT_{CHAR}$ of 67.

The high-slope problem can also be addressed by using more than one $RT_{CHAR}$ to represent the model use case. For example, a first $RT_{CHAR}$ having a reduced value can be used for the first three months of retention and there will be no need to reduce the $DWRT_{CHAR}$ after the end of the first three months. Therefore the $DWRT_{CHAR}$ for months 4, 5 and 6 will remain at 70. In other embodiments more than two values of $DWRT_{CHAR}$ can be used, depending on the characteristics of the model use case. In the present embodiment, when more than one $DWRT_{CHAR}$ is used a table is stored in step 401 that includes $DWRT_{CHAR}$ indexed by retention time.

Following is an exemplary calculation of $\Delta R(t,ts)$ using the test data of FIG. 7. Test codewords are read at a time t and the total number of errors in each codeword (#errors(t)) is determined. The determined total number of errors in each codeword is then stored. At a time t+ts the same test codewords are again read and the total number of errors in each codeword is determined (#errors(t+ts)). The determined total number of errors in each codeword at time t (#errors(t)) is then subtracted from the determined total number of errors in that codeword at time ts (#errors(t+ts)) to obtain a $\Delta R(t,ts)$ value for each tested codeword. The test is repeated for each successive time interval ts to obtain a marginal error profile that characterizes the use case modeled by the test criteria.

Figure 11:
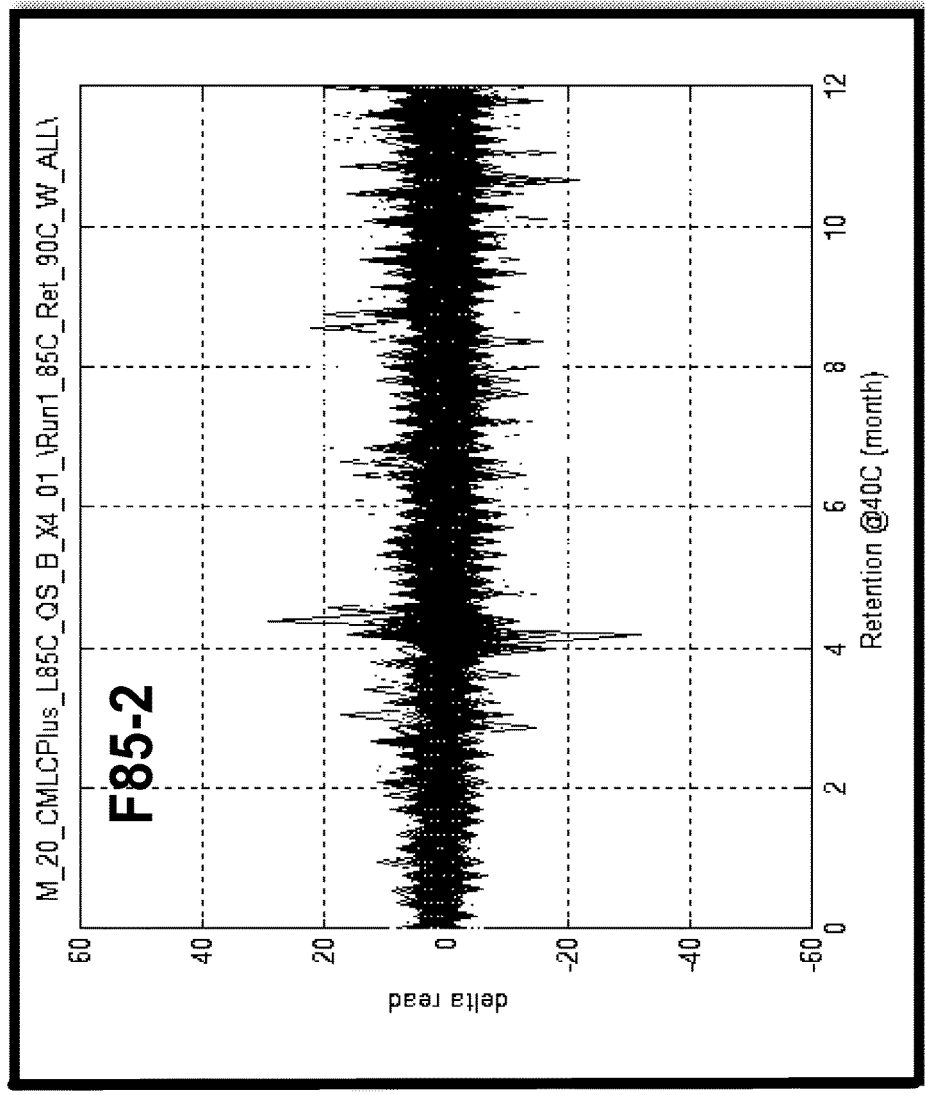
FIG. 11 is a diagram illustrating test results for a test NAND device during retention, showing DeltaR(t) on the vertical axis and retention time on the horizontal axis for the use case shown in FIG. 7 in accordance with an embodiment of the invention.

FIG. 11 shows a graph of $\Delta R(t,ts)$ for the NAND device tested in FIG. 7 for a use case F85-2. Use case F85-2 is performed at a temperature of 85 degrees and a ts of one day. It can be seen that $\Delta R(t,ts)$ is both positive and negative for each time t. In this test 16 die were tested and 192 blocks per die were tested.

Figure 12:
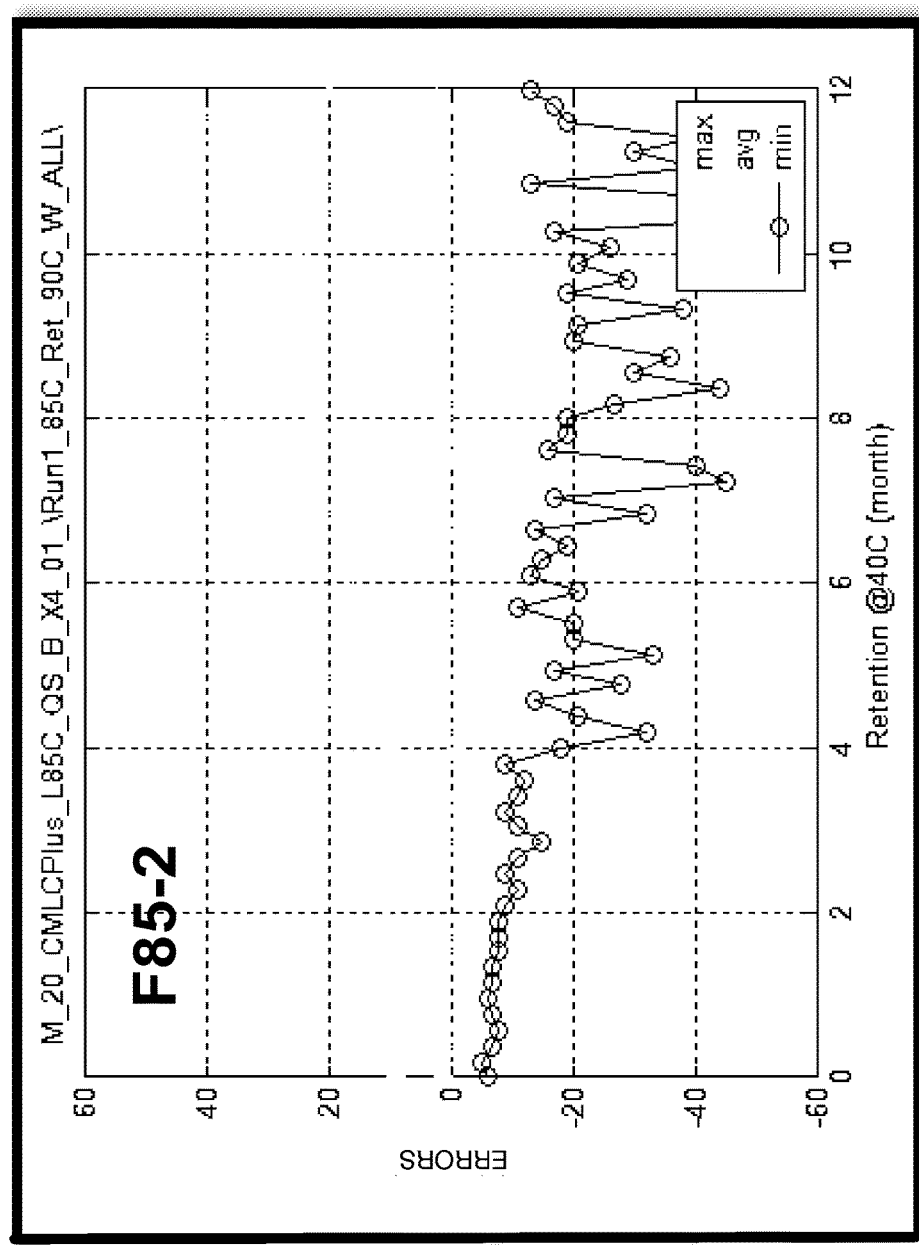
FIG. 12 is a diagram illustrating test results for a test NAND device during retention, showing errors on the vertical axis and retention time on the horizontal axis for the use case shown in FIG. 11 and shows maximum DeltaR(t), minimum DeltaR(t) and average DeltaR(t) in accordance with an embodiment of the invention.

In one embodiment the $\Delta R(t,ts)$ value chosen to be $\Delta R(t,ts)_{CHAR}$ is based on the maximum and minimum $\Delta R(t,ts)$ at each time t. FIG. 12 shows a graph of $\Delta R(t,ts)$ on the vertical axis and retention time on the horizontal axis and illustrates the maximum and minimum $\Delta R(t,ts)$ at each retention time for use case F85-2.

Figure 13:
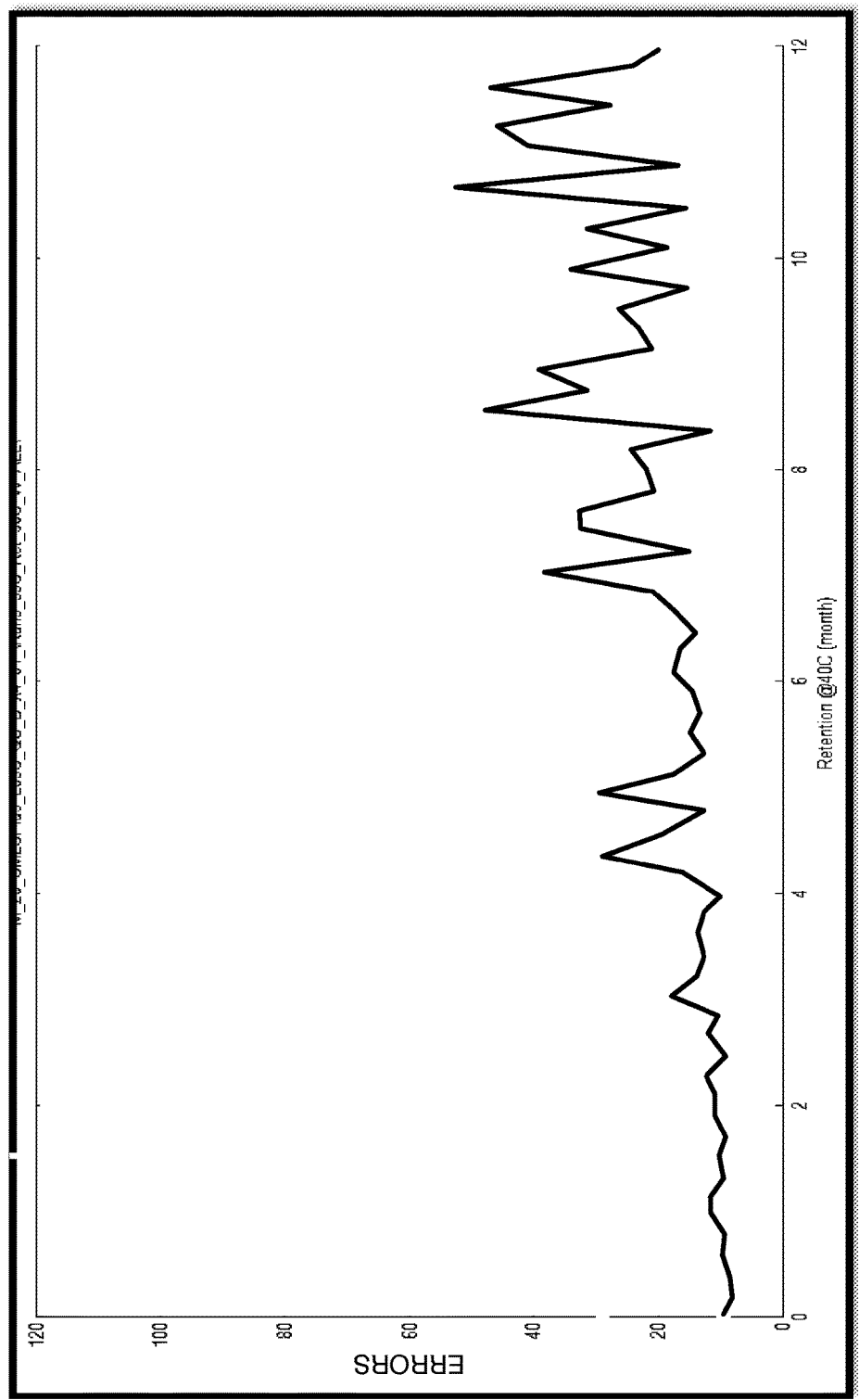
FIG. 13 is a diagram illustrating test results for a test NAND device during retention, showing maximum absolute DeltaR(t) on the vertical axis and retention time on the horizontal axis for the use case shown in FIG. 11 in accordance with an embodiment of the invention.

FIG. 13 shows a graph of $\Delta R(t,ts)$ on the vertical axis and retention time on the horizontal axis and illustrates the maximum $|\Delta R(t,ts)|$ at each retention time for use case F55-2 and use case F85-2. In the present embodiment the absolute value of each $\Delta R(t,ts)$ value is determined ($|\Delta R(t,ts)|$) and the maximum $|\Delta R(t,ts)|$ value is plotted for each time t.

In the present embodiment a single $\Delta R(t,ts)_{CHAR}$ is chosen to be the highest maximum $|\Delta R(t,ts)|$ over the interval between t=0 and the time period t. For example, the $\Delta R(t,ts)_{CHAR}$ for the time of 10 days is 9 errors. For each $\Delta R(t,ts)_{CHAR}$ up to 20 days the $\Delta R(t,ts)_{CHAR}$ will remain at 10 errors. At 30 days $\Delta R(t,ts)_{CHAR}$ rises to 10 errors. For periods between 30 days and the end of specification retention time, the $\Delta R(t,ts)_{CHAR}$ will remain at 10 errors.

The $\Delta R(t,ts)_{CHAR}$ and corresponding time t for each $\Delta R(t,ts)_{CHAR}$ are stored (step 401). This can be, for example, a table with $\Delta R(t,ts)_{CHAR}$ and corresponding time (t) for every time (t) and incremented by is within the lifetime of the NAND devices 110 or until some earlier cutoff period such as, for example, the specification retention time.

Though FIG. 4 describes using both online and offline testing, in one embodiment only offline testing is performed. More particularly, retention monitor 120 does not include an online test module 123 and steps 410-412 of FIG. 4 are not performed. In an alternate embodiment only online testing is performed and retention monitor 120 does not include an offline test module 122 and steps 406-408 of FIG. 4 are not performed.

In various embodiments, the system of the present invention may be implemented in a Field Programmable Gate Array (FPGA) or Application Specific Integrated Circuit (ASIC).

Though the method and apparatus of the present invention is described above with respect to a single level memory cell, it is within the scope of the present invention to extend the methods and apparatus of the present invention to MLC (multiple-level cell) devices, as would be evident to one of skill in the art. In this embodiment, the memory cells of NAND devices 150 are multi-level cells and the steps of FIGS. 4 and 7-8 are performed using multi-level cells.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A nonvolatile memory controller including a programming circuit for programming a nonvolatile memory device using an error correction code having a maximum error correction capacity, a read circuit for sending an instruction to perform a read operation to the nonvolatile memory device, a decode circuit for decoding the results of the read operation and for determining a number of errors in the read operation, memory storage for storing a threshold value, a comparison circuit for comparing the determined number of errors in the read operation to the stored threshold value and a circuit for retiring a block or page of the nonvolatile memory device when the determined number of errors exceeds the stored threshold value, a start-up circuit to initiate normal operation of the nonvolatile memory controller in response to receiving one or more of a power-on signal, a start-up signal and applied power at the nonvolatile memory controller, and a power-down circuit configured to power down the nonvolatile memory controller in response to receipt of a power-off signal at the nonvolatile memory controller, the nonvolatile memory controller comprising: a first offline test circuit coupled to the read circuit, the decode circuit and the power-down circuit, the first offline test circuit operable to perform a first offline test by instructing the read circuit, after the power-off signal is received and prior to a subsequent powering down of the nonvolatile memory controller, to perform a first read of each of a plurality of test codewords stored on the nonvolatile memory device, the decode circuit operable to decode each of the reads of the first offline test to determine a number of errors in the performed first read of each of the test codewords, and the first offline test circuit operable to compare each determined number of errors in the first read of each test codeword to a determined number of errors in the first read of a different one of the test codewords to identify a number of errors in the first read of the plurality of test codewords having the highest number of errors at a first time; a second offline test circuit coupled to the read circuit, the decode circuit and the start-up circuit, the second offline test circuit operable to perform a second offline test by instructing the read circuit, after receipt of one or more of the power-on signal, the start-up signal and the applied power and prior to a subsequent initiating normal operation of the nonvolatile memory controller, to perform a second read of each of the test codewords, the decode circuit operable to decode each of the second reads to determine a number of errors in the second read of each of the test codewords, and the second offline test circuit operable to compare each determined number of errors in the second read of each test codeword to a determined number of errors in the second read of a different one of the test codewords to identify a number of errors in the second read of the plurality of test codewords having the highest number of errors at a second time; and a retention monitor circuit coupled to the first offline test circuit and to the second offline test circuit, the retention monitor circuit operable to subtract the number of errors in the test codeword having the highest number of errors at the first time from the number of errors in the test codeword having the highest number of errors at the second time to identify a delta worst value, to subtract the delta worst value from the maximum error correction capacity of the error correction code to determine a delta worst retention threshold, to compare the delta worst retention threshold to the stored threshold value and to replace the stored threshold value with the delta worst retention threshold if the delta worst retention threshold exceeds the stored threshold value.

2. The nonvolatile memory controller of claim 1 wherein the nonvolatile memory controller further comprises a Field Programmable Gate Array (FPGA).

3. A nonvolatile memory controller including a programming circuit for programming a nonvolatile memory device, a read circuit for sending an instruction to perform a read operation to the nonvolatile memory device, a decode circuit for decoding the results of the read operation and for determining a number of errors in the read operation, memory storage for storing a threshold value, a comparison circuit for comparing the determined number of errors in the read operation to the stored threshold value and a circuit for retiring a block or page of the nonvolatile memory device when the determined number of errors exceeds the stored threshold value, a start-up circuit configured to initiate normal operation of the nonvolatile memory controller in response to receiving at the nonvolatile memory controller one or more of a power-on signal, a start-up signal and applied power, and a power-down circuit configured to power down the nonvolatile memory controller in response to receiving a power-off signal at the nonvolatile memory controller, the nonvolatile memory controller comprising: an online test circuit configured to periodically perform an online retention test by reading a first codeword stored in the nonvolatile memory device and determine a number of errors in the first codeword at a first time, repeating the reading the first codeword and the determining the number of errors in the first codeword to determine a number of errors in the first codeword at a second time, determine a marginal error rate by subtracting the determined number of errors in the first codeword at the first time from the determined number of errors in the first codeword at the second time, determine the temperature of the memory controller, determine an acceleration factor corresponding to the determined temperature, and update the stored threshold value if the determined marginal error rate multiplied by the acceleration factor exceeds a characterized marginal error rate corresponding to a use case; and a first offline test circuit coupled to the read circuit and the decode circuit and the power-down circuit, the first offline test circuit operable to perform a first offline test by instructing the read circuit, after the power-off signal is received and prior to a subsequent powering down the nonvolatile memory controller, to perform a first read of each of a plurality of test codewords stored on the nonvolatile memory device, the decode circuit operable to decode each of the reads in the first offline test to determine a number of errors in a first read of each of the test codewords, and the first offline test circuit further configured to compare each determined number of errors in the first read of the test codeword to a determined number of errors in the first read of a different one of the test codewords to identify a number of errors in the test codeword having the highest number of errors at a third time; a second offline test circuit coupled to the read circuit, the decode circuit and the start-up circuit, the second offline test circuit operable to perform a second offline test by instructing the read circuit, after the receiving at the nonvolatile memory controller one or more of a power-on signal, a start-up signal and applied power and prior to a subsequent initiating normal operation of the nonvolatile memory controller, to perform a second read of each of the test codewords, the decode circuit operable to decode each of the reads in the second offline test to determine a number of errors in the second read of each of the test codewords, and the second offline test circuit operable to compare each determined number of errors in the second read of each test codeword to a determined number of errors in the second read of a different one of the test codewords to identify a number of errors in the test codeword having the highest number of errors at a fourth time; and a timing circuit configured to determine offline retention time, wherein the offline retention time is the duration of a time interval that starts after the power-off signal is received and prior to the subsequent powering down the nonvolatile memory controller, and stops after the receiving at the nonvolatile memory controller one or more of a power-on signal, a start-up signal and applied power, and prior to the subsequent initiating normal operation of the nonvolatile memory controller; and a retention monitor circuit coupled to the first offline test circuit, the second offline test circuit and the timing circuit, the retention monitor circuit configured to subtract the number of errors in the test codeword having the highest number of errors at the third time from the number of errors in the test codeword having the highest number of errors at the fourth time to determine a delta worst value, to compare the delta worst value to an offline test characteristics corresponding to the use case, to compare the determined offline retention time to a time value corresponding to the use case, and to replace the stored threshold value with an adjusted threshold value when the comparison indicates that the delta worst value exceeds the offline test characteristic corresponding to the use case and the determined offline retention time does not exceed the time value corresponding to the use case.

4. The nonvolatile memory controller of claim 3 wherein the test codewords comprise a logical block of the nonvolatile memory device.

5. The nonvolatile memory controller of claim 3 wherein the retention monitor circuit is configured to calculate the adjusted threshold value by multiplying the stored threshold value by a correction factor.

6. The nonvolatile memory controller of claim 3 wherein the nonvolatile memory controller further comprises a Field Programmable Gate Array (FPGA).

7. A nonvolatile memory controller including a programming circuit for programming a nonvolatile memory device, a read circuit for sending an instruction to perform a read operation to the nonvolatile memory device, a decode circuit for decoding the results of the read operation and for determining a number of errors in the read operation, a comparison circuit for comparing the determined number of errors in the read operation to a stored threshold value and a circuit for retiring a block or page of the nonvolatile memory device when the determined number of errors exceeds the stored threshold value, a start-up circuit configured to initiate normal operation of the nonvolatile memory controller in response to receiving one or more of a power-on signal, a start-up signal and applied power at the nonvolatile memory controller and a power-down circuit configured to enter a low-power mode in response to receiving a power-off signal at the nonvolatile memory controller, the nonvolatile memory controller comprising: a first offline test circuit coupled to the read circuit, the decode circuit and the power-down circuit, the first offline test circuit operable to perform a first offline test by instructing the read circuit, after the power-off signal is received and prior to the entering the low-power mode, to perform a first read of each of a plurality of test codewords stored on the nonvolatile memory device, the decode circuit operable to decode each of the reads to determine a number of errors in a first read of each of the test codewords, and the first offline test circuit further configured to compare each determined number of errors in the first read of the test codeword to a determined number of errors in the first read of a different one of the test codewords to identify a number of errors in the test codeword having the highest number of errors at a first time; and a second offline test circuit coupled to the read circuit, the decode circuit and the start-up circuit, the second offline test circuit operable to perform a second offline test by instructing the read circuit, after the receiving one or more of a power-on signal, a start-up signal and applied power and prior to a subsequent initiating normal operation of the nonvolatile memory controller, to perform a second read of each of the test codewords, the decode circuit operable to decode each of the reads in the second offline test to determine a number of errors in a second read of each of the test codewords, and the second offline test circuit operable to compare each determined number of errors in the second read of each test codeword to a determined number of errors in the second read of a different one of the test codewords to identify a number of errors in the test codeword having the highest number of errors at a second time; a timing circuit for determining offline retention time, wherein the timing circuit includes a timer that is started after the power-off signal is received and prior to the entering a low-power mode and stopped after the receiving one or more of a power-on signal, a start-up signal and applied power, and prior to the subsequent initiating normal operation of the nonvolatile memory controller; and a retention monitor circuit coupled to one or more pins, the timing circuit, the first offline test circuit and the second offline test circuit, the retention monitor circuit operable to compare the determined offline retention time and the results of the first and second offline tests to the corresponding offline test characteristics corresponding to a use case to determine whether the results of the first and second offline tests deviate from the offline test characteristics corresponding to the use case and to replace the stored threshold value with an adjusted threshold value when the comparison indicates that the results of the first and second offline tests deviate from the offline test characteristics corresponding to the use case.

8. The nonvolatile memory controller of claim 7 wherein the retention monitor circuit is configured to subtract the number of errors in the test codeword having the highest number of errors at the first time from the number of errors in the test codeword having the highest number of errors at the second time to identify a delta worst value, and is further configured to subtract the delta worst value from the maximum error correction capacity of an error correction code to determine a delta worst retention threshold, to compare the delta worst retention threshold to the stored threshold and to replace the stored threshold value with the delta worst retention threshold if the delta worst retention threshold exceeds the stored threshold value.

9. The nonvolatile memory controller of claim 7 further comprising an online test circuit configured to periodically perform an online retention test by reading a first codeword stored in the nonvolatile memory device and determine a number of errors in the first codeword at a third time, repeating the reading the first codeword and the determining the number of errors in the first codeword to determine a number of errors in the first codeword at a fourth time, determine a marginal error rate by subtracting the determined number of errors in the first codeword at the third time from the determined number of errors in the first codeword at the fourth time, determine the temperature of the memory controller, determine an acceleration factor corresponding to the determined temperature, and update the threshold if the determined marginal error rate multiplied by the acceleration factor exceeds a characterized marginal error rate corresponding to the use case.

10. The nonvolatile memory controller of claim 7 wherein the nonvolatile memory controller further comprises a Field Programmable Gate Array (FPGA).

* * * * *

UNITED STATES PATENT AND TRADEMARK OFFICE
CERTIFICATE OF CORRECTION

PATENT NO. : 10,332,613 B1
APPLICATION NO. : 14/715403
DATED : June 25, 2019
INVENTOR(S) : Rino Micheloni, Alessia Marelli and Robert Scott Fryman It is certified that error appears in the above-identified patent and that said Letters Patent is hereby corrected as shown below:

In the Specification

In Column 11, Line 57, delete "is" and insert --ts--.

Signed and Sealed this
Twelfth Day of May, 2020

Andrei Iancu
*Director of the United States Patent and Trademark Office*